United States Patent [19]
Mochizuki et al.

[11] Patent Number: 5,537,354
[45] Date of Patent: Jul. 16, 1996

[54] SEMICONDUCTOR MEMORY DEVICE AND METHOD OF FORMING THE SAME

[75] Inventors: Hirohiko Mochizuki; Yoshihiro Takemae; Yukinori Kodama; Makoto Yanagisawa; Hiroyoshi Tomita, all of Kawasaki, Japan

[73] Assignee: Fujitsu Limited, Kawasaki, Japan

[21] Appl. No.: 357,307

[22] Filed: Dec. 14, 1994

[30] Foreign Application Priority Data

Dec. 15, 1993 [JP] Japan .................................. 5-313921

[51] Int. Cl.$^6$ .................................................. G11C 13/00
[52] U.S. Cl. ............................. 365/189.04; 365/230.01
[58] Field of Search .................... 365/189.01, 189.04, 365/230.01, 230.04, 189.02, 230.03

[56] References Cited

U.S. PATENT DOCUMENTS 4,646,271  2/1987  Uchiyama et al. ............. 365/189.01

*Primary Examiner*—Terrell W. Fears
*Attorney, Agent, or Firm*—Nikaido, Marmelstein, Murray & Oram

[57] ABSTRACT

A method of making an SDRAM (synchronous dynamic random access memory) into either a low-speed type or a high-speed type includes the steps of determining an electrical connection of a predetermined electrode of the SDRAM, and providing the predetermined electrode with a voltage level defined by the electrical connection, the voltage level determining whether the SDRAM is made into the low-speed type or the high speed type, wherein the low-speed type can carry out consecutive writing operations at a low clock rate for two addresses having the same row address, and the high-speed type can carry out simultaneous writing operations at a high clock rate for two addresses having the same row address and consecutive column addresses.

11 Claims, 35 Drawing Sheets

200A

200A

200A

SEMICONDUCTOR MEMORY DEVICE AND METHOD OF FORMING THE SAME

BACKGROUND OF THE INVENTION

1. Field of the Invention

The present invention generally relates to methods of forming DRAMs (dynamic random access memory), and more particularly relates to a method of forming synchronous DRAMs (hereinafter called SDRAM), which operates in synchronism with an external clock signal provided from an external source.

2. Description of the Prior Art

There are different types of SDRAMs operating at different frequencies of an external clock signal. One of such SDRAMs is a low-speed one operating at 66 MHz, and another is a high-speed one operating at 125 MHz.

The high-speed SDRAMs include a SDRAM which has two data buses provided for one memory block, and another SDRAM in which one memory block is divided into two memory blocks.

In consecutive data writing, those high-speed SDRAMs receive two data in a sequence, synchronized with an external clock signal, within a time period of two cycles. Those two data are arranged in parallel, and written into the SDRAMs simultaneously within two cycles, which are called a 2 cycle pre-fetch operation. In this manner, those SDRAMs realize a high-speed operation.

In simultaneous data writing of those high-speed SDRAMs, however, data are required to be written into addresses of consecutive column addresses within the same row address. Even if a row address is the same, however, data cannot be simultaneously written into two addresses when their column addresses are not consecutive. Thus, the high-speed SDRAMs require only two cycles for consecutive data writing (simultaneous data writing in actuality) when two addresses have the same row address and consecutive column addresses. However, four cycles become necessary for writing two data when two addresses have the same row address but non-consecutive column addresses.

Nonetheless, the high-speed SDRAMs operate at such a high speed that there is little problem even though consecutive data writing cannot be conducted for addresses having the same row address and non-consequtive column addresses.

On the other hand, the low-speed SDRAMs require consecutive data writing, regardless of column addresses, for two addresses having the same row address in order to make up for their low operating speed. Thus, the low-speed SDRAMs are designed such that consecutive writing operations can be carried out for two column addresses having the same row address.

It might be convenient if there is a single method of manufacturing both the low-speed SDRAMs, which can carry out consecutive writing operations for two addresses having the same row address and arbitrary column addresses, and the high-speed SDRAMs, which can carry out the 2 cycle pre-fetch operations for two addresses having the same row address and consecutive column addresses. Such a method which can readily switch between the manufacturing of the low-speed SDRAMs and the manufacturing of high-speed SDRAMs may bring about a significant advantage in the operations management.

Accordingly, there is a need in the field of SDRAMs for a method of manufacturing both the low-speed SDRAMs and the high-speed SDRAMs which can readily switch from the manufacturing of one type of SDRAMs to the manufacturing of the other type of SDRAMs.

SUMMARY OF THE INVENTION

Accordingly, it is a general object of the present invention to provide a method which can satisfy the need described above.

Also, it is another and more specific object of the present invention to provide a method of manufacturing both the low-speed SDRAMs and the high-speed SDRAMs which can readily switch from the manufacturing of one type of SDRAMs to the manufacturing of the other type of SDRAMs.

In order to achieve the above objects, a method of making an SDRAM into either a low-speed type or a high-speed type according to the present invention includes the steps of determining an electrical connection of a predetermined electrode of the SDRAM, and providing the predetermined electrode with a voltage level defined by the electrical connection, wherein the voltage level determines whether the SDRAM is made into the low-speed type or the high speed type, and wherein the low-speed type can carry out consecutive writing operations at a low clock rate for two addresses having the same row address, and the high-speed type can carry out simultaneous writing operations at a high clock rate for two addresses having the same row address and consecutive column addresses.

According to the present invention, the SDRAM can be made into either the low-speed SDRAM or the high-speed SDRAM by determining an electrical connection of the predetermined electrode and providing the predetermined electrode with a voltage level defined by the electrical connection. A process of making the SDRAM into either the high-speed SDRAM or the low-speed SDRAM is simple and easy to implement, so that the process can readily switch from the manufacturing of one type of SDRAMs to the manufacturing of the other type of SDRAMs.

It is still another object of the present invention to provide a SDRAM which can be made into either the low-speed SDRAM or the high-speed SDRAM through a simple process.

In order to achieve the above object, an SDRAM which can be made into either a low-speed type or a high-speed type according to the present invention includes a control circuit controlling an operation of the SDRAM, and an electrode connected to the control circuit, wherein a voltage level applied to the electrode determines which one of the low-speed type or the high-speed type is formed.

According to the present invention, the SDRAM can be made into either the low-speed SDRAM or the high-speed SDRAM by applying different voltage level to the electrode. Thus, the present invention can provide an SDRAM which can be made into either the low-speed SDRAM or the high-speed SDRAM through a simple process.

Other objects and further features of the present invention will be apparent from the following detailed description when read in conjunction with the accompanying drawings.

DESCRIPTION OF THE PREFERRED EMBODIMENTS

In the following, embodiment of the present invention will be described with reference to the accompanying drawings.

Figure 1:
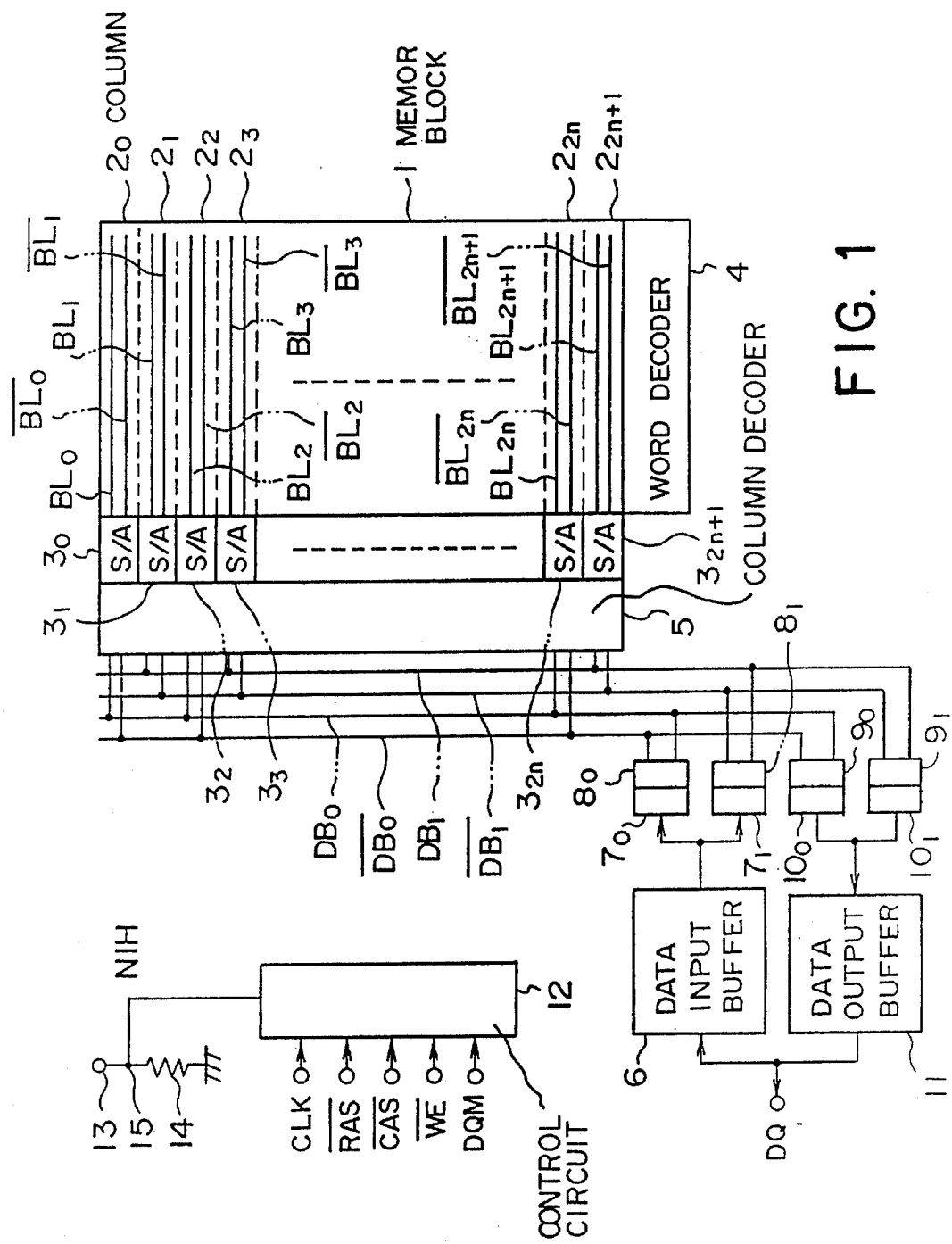
FIG. 1 is a block diagram for explaining a first embodiment of a method of forming an SDRAM according to the present invention.

FIG. 1 is a block diagram for explaining a first embodiment of a method of forming SDRAMs according to the present invention. In FIG. 1, a circuit structure on a chip before the chip is subject to a bonding process is shown.

The SDRAMs of the first embodiment have two data buses provided for one memory block. In FIG. 1, a memory block 1 is made up from an array of memory cells.

$2_0, 2_1, \ldots$, and $2_{2n+1}$ represent columns of the memory block 1, and $BL_j$ and $/BL_j$ ($j=0, 1, \ldots, 2n+1$) represent a pair of bit lines provided for each columns $2j$. Sense amplifiers $3j$ are also provided for each columns $2j$.

A word decoder 4 selects and drives one word line among word lines of the memory block 1 by decoding a row address signal. A column decoder 5 selects one column from columns of the memory block 1 by decoding a column address signal.

A pair of data bus lines $DB_0$ and $/DB_0$ are provided for the even number columns $2_0, 2_2, \ldots$, and $2_{2n}$. The data bus line $DB_0$ is shared by the bit lines $BL_0, BL_2, \ldots$, and $BL_{2n}$, and the data bus line $/DB_0$ is shared by the bit lines $/BL_0, /BL_2, \ldots$, and $/BL_{2n}$.

A pair of data bus lines $DB_1$ and $/DB_1$ are provided for the odd number columns $2_1, 2_3, \ldots$, and $2_{2n+1}$. The data bus line $DB_1$ is shared by the bit lines $BL_1, BL_3, \ldots$, and $BL_{2n+1}$, and the data bus line $/DB_1$ is shared by the bit lines $/BL_1, /BL_3, \ldots$, and $/BL_{2n+1}$.

A data input buffer 6 receives write data, and write-data latch circuits $7_0$ and $7_1$ latch write data received by the data input buffer 6.

A write amplifier $8_0$ is used for writing the write data latched by the write data latch circuit $7_0$ into the memory block 1, and are provided for the even number columns $2_0, 2_2, \ldots$, and $2_{2n}$. A write amplifier $8_1$ is used for writing the write data latched by the write data latch circuit $7_1$ into the memory block 1, and are provided for the odd number columns $2_1, 2_3, \ldots$, and $2_{2n+1}$.

A data bus amplifier $9_0$ amplifies data on the data bus lines $DB_0$ and $/DB_0$ read from the memory block 1 via the column decoder 5. A read-data latch circuit $10_0$ latches data which is amplified by the data bus amplifier $9_0$.

A data bus amplifier $9_1$ amplifies data on the data bus lines $DB_1$ and $/DB_1$ read from the memory block 1 via the column decoder 5. A read-data latch circuit $10_1$ latches data which is amplified by the data bus amplifier $9_1$.

A data output buffer 11 outputs the data latched by the read data latch circuit $10_0$ and $10_1$.

A control circuit 12 receives a clock signal CLK, a row address strobe signal /RAS, a column address strobe signal /CAS, a write control signal /WE, and a data mask signal DQM form external sources.

A circuit including a bonding pad 13 and a resister 14 provides an operation mode signal N1H at a node 15. The operation mode signal N1H determines whether the SDRAM is to operate as a low-speed SDRAM or as a high-speed SDRAM.

Figure 2:
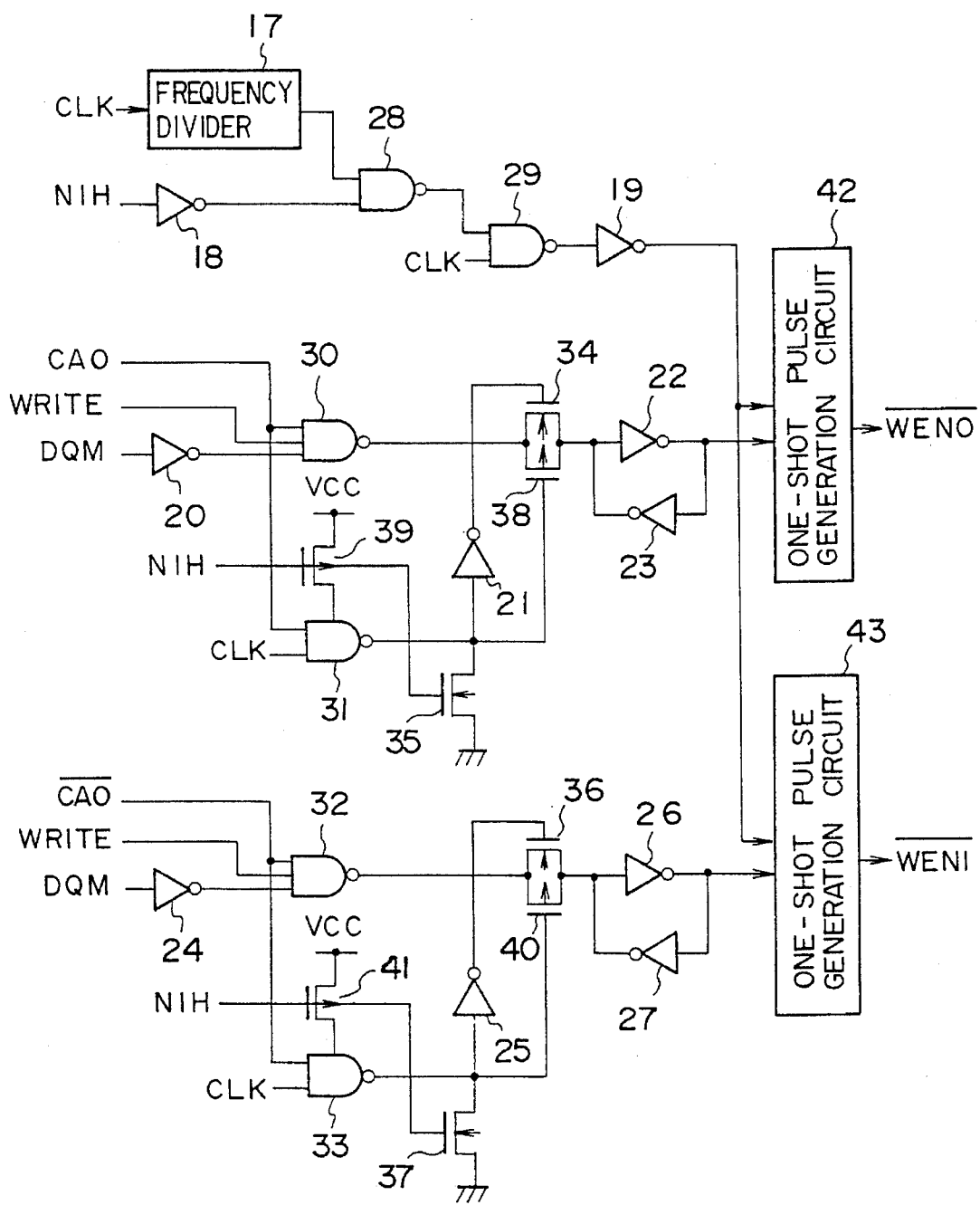
FIG. 2 is a circuit diagram of a write-amplifier-output control-signal generation circuit forming part of a control circuit of FIG. 1.

FIG. 2 shows a write-amplifier-output control-signal generation circuit, which is included in the control circuit 12 and generates a write-amplifier control signal for controlling the write data output of the write amplifier $8_0$ and $8_1$.

In FIG. 2, the least significant bit CA0 of a column address signal indicates whether the even number columns $2_0, 2_2, \ldots$, and $2_{2n}$ are selected in the memory block 1, or the odd number columns $2_1, 2_3, \ldots$, and $2_{2n+1}$ are selected.

A write control signal WRITE is generated inside the control circuit 12, which is set to a high level for writing and to a low level for reading. A write-amplifier-output control signal /WEN0 is used for controlling the output of the write amplifier $8_0$, and a write-amplifier-output control signal /WEN1 is used for controlling the output of the write amplifier $8_1$.

A frequency divider 17 divides an external clock signal CLK into half. Also, the circuit of FIG. 2 includes inverters 18 to 27, NAND circuits 28 to 33, nMOS transistors 34 to 37, pMOS transistors 38 to 41, and one-shot pulse generation circuits 42 and 43.

Figure 3:
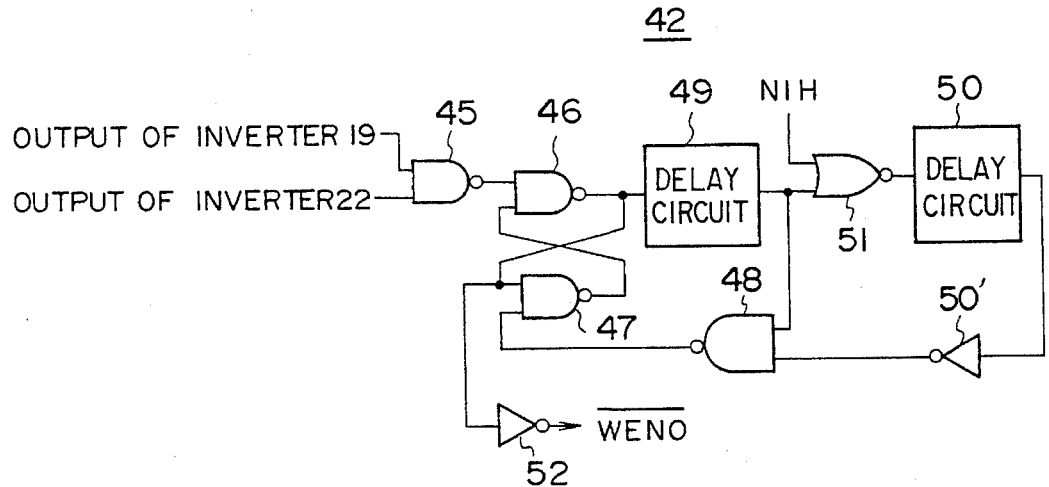
FIG. 3 is a circuit diagram of a one-shot pulse generation circuit provided in the write-amplifier-output control-signal generation circuit of FIG. 2.

FIG. 3 shows a circuit structure of the one-shot pulse generation circuits 42. The one-shot pulse generation circuits 42 includes NAND circuits 45 to 48, delay circuits 49 and 50, a NOR circuit 51, and inverters 50' and 52. Here, the NAND circuits 46 and 47 together form a RS flip-flop circuit.

Figure 4:
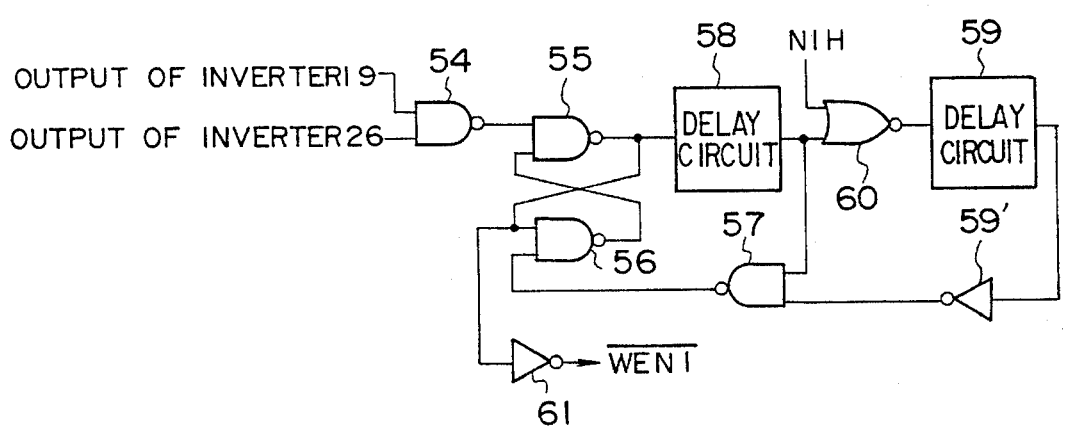
FIG. 4 is a circuit diagram of another one-shot pulse generation circuit provided in the write-amplifier-output control-signal generation circuit of FIG. 2.
Figure 5:
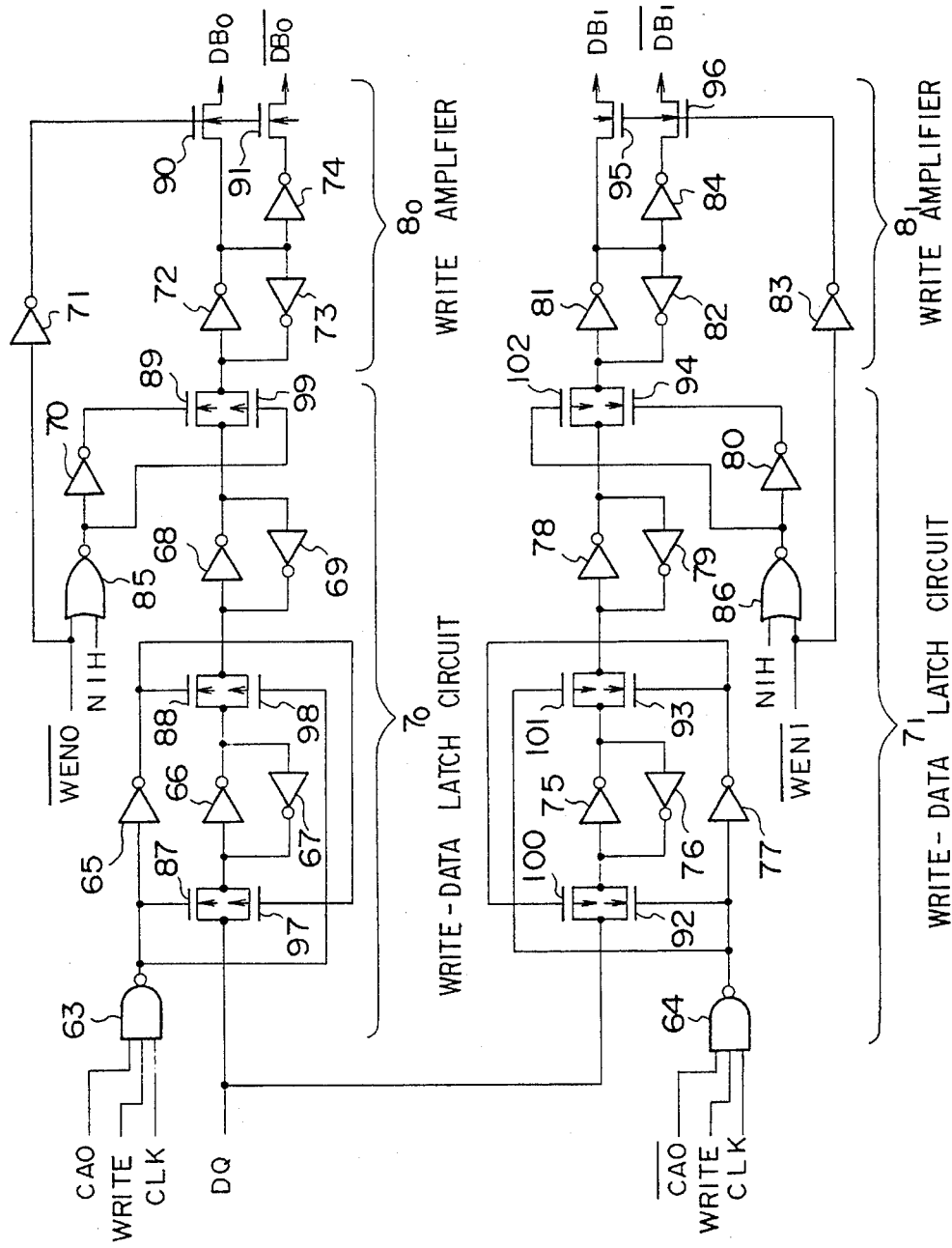
FIG. 5 is a circuit diagram of a write-data latch circuit and a write amplifier of FIG. 1.

FIG. 4 shows a circuit structure of the one-shot pulse generation circuits 43. The one-shot pulse generation circuits 42 includes NAND circuits 54 to 57, delay circuits 58 and 59, a NOR circuit 60, and inverters 59' and 61. Here, the NAND circuits 55 and 56 together form a RS flip-flop circuit. The delay circuits 58 and 59 have the same time delays as those of the delay circuits 49 and 50 of FIG. 3, respectively, FIG. 5 shows a circuit structure of the write-data latch circuits $7_0$ and $7_1$ and the write amplifier $8_0$ and $8_1$. The circuit structure of FIG. 5 includes NAND circuits 63 and 64, inverters 65 to 84, NOR circuits 85 and 86, nMOS transistors 87 to 96, and pMOS transistors 97 to 102.

Figure 6:
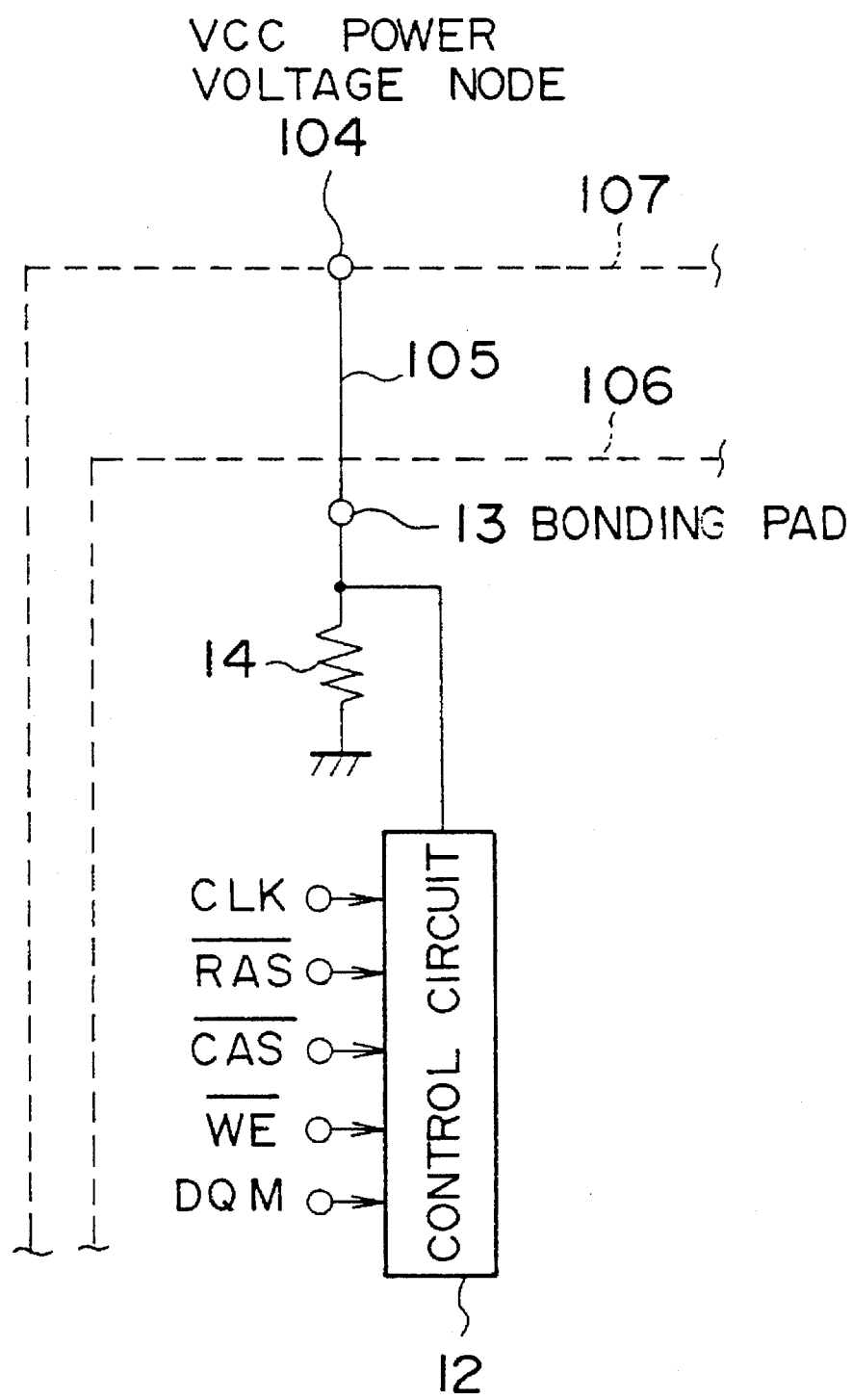
FIG. 6 is an illustrative drawing for explaining the first embodiment of a method of forming an SDRAM according to the present invention, showing a case of forming a low-speed SDRAM.

As shown in FIG. 6, when forming a low-speed SDRAM according to the first embodiment of the present invention, the bonding pad 13 is connected via a wire 105 to an external node (hereinafter called a VCC power node) 104 to which a power voltage level VCC is applied. Here, a chip is indicated by 106 and a package is indicated by 107.

Figure 7:
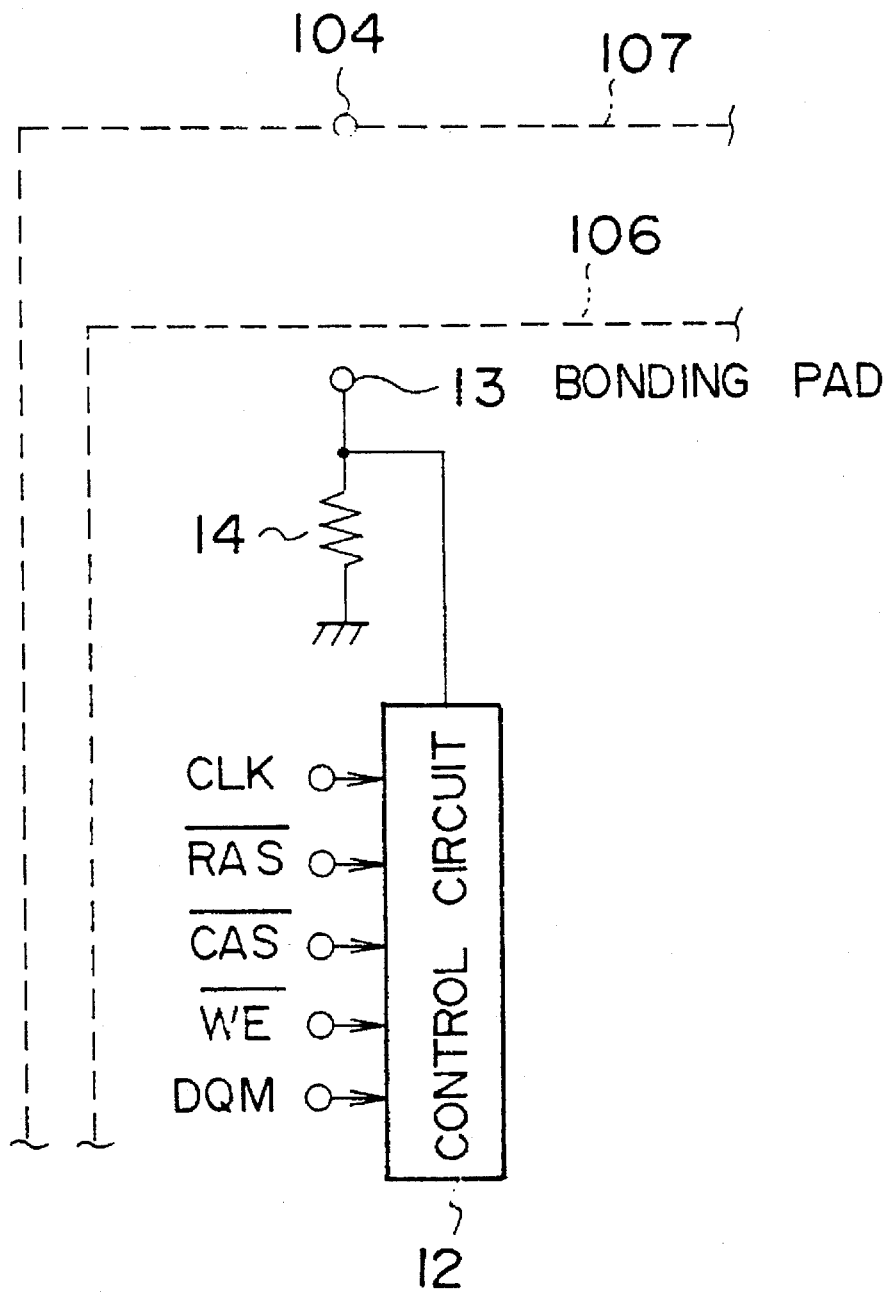
FIG. 7 is an illustrative drawing for explaining the first embodiment of a method of forming an SDRAM according to the present invention, showing a case of forming a high-speed SDRAM.

On the other hand, when forming a high-speed SDRAM, the bonding pad 13 is not connected to the VCC power node 104, as shown in FIG. 7.

Figure 8:
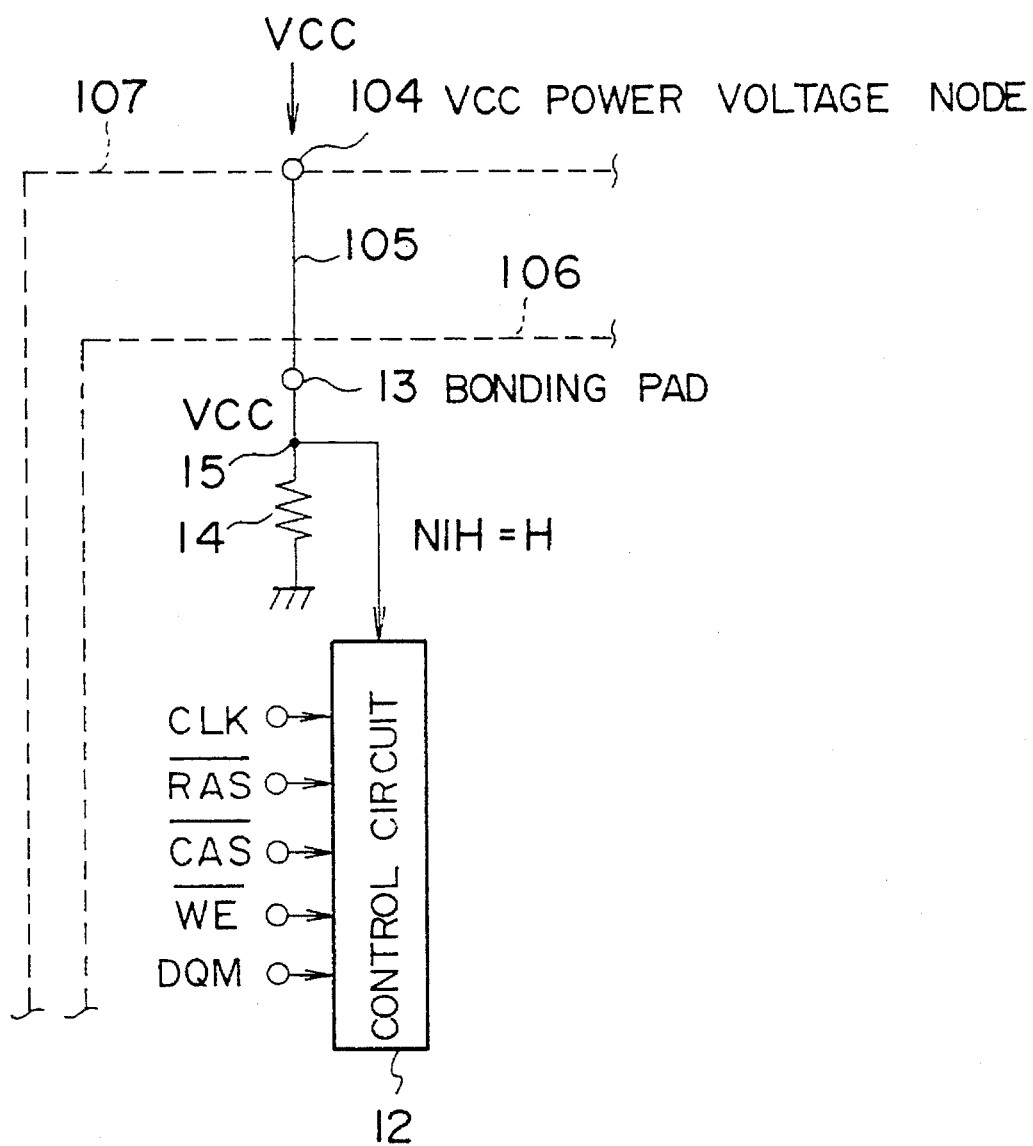
FIG. 8 is a circuit diagram for explaining an operation of the low-speed SDRAM of the first embodiment.

As shown in FIG. 8, if the bonding pad 13 is connected to the VCC power node 104 in order to form a low-speed SDRAM, the voltage level of the node 15 becomes VCC. Thus, the operation mode signal N1H having a high level is obtained.

Figure 9:
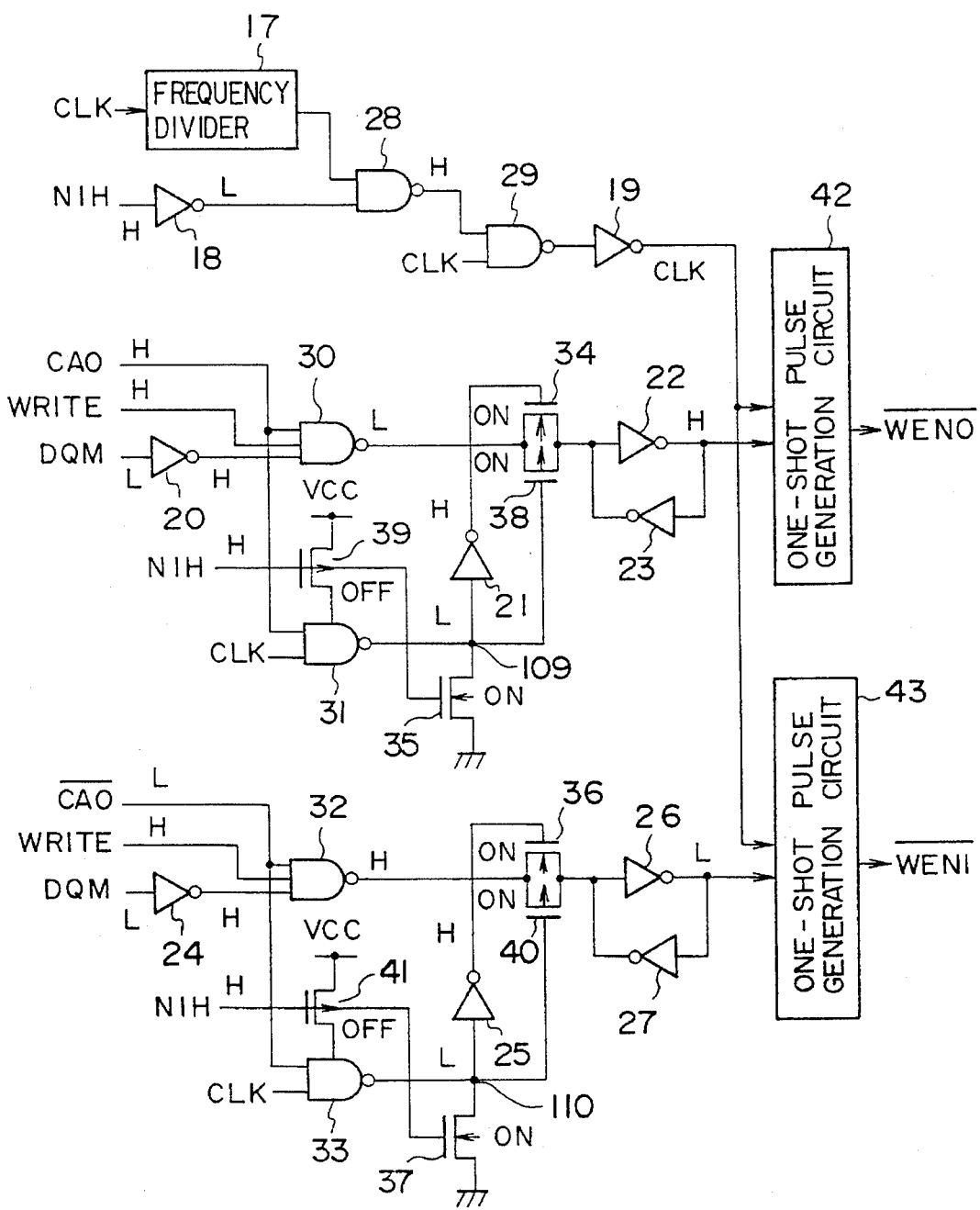
FIG. 9 is a circuit diagram for explaining an operation of the write-amplifier-output control-signal generation circuit of FIG. 2 in the case of the low-speed SDRAM of the first embodiment.

As a result, as shown in FIG. 9, the inverter 18 of the write-amplifier-output control-signal generation circuit has a low-level output. Then, the output of the NAND circuit 28 is fixed to a high level, so that the NAND circuit 29 works as an inverter for the external clock signal CLK.

For example, if the external clock signal CLK is 66 MHz, the inverter 19 outputs a signal identical to the external clock signal CLK of 66 MHz. This signal is supplied to the one-shot pulse generation circuits 42 and 43.

Also, the operation mode signal N1H is the high level, so that the pMOS transistor 39 is turned off and the nMOS transistor 35 is turned on. Thus, a node 109 becomes the low level, and the output of the inverter 21 becomes the high level. This leads to the nMOS transistor 34 and the pMOS transistor 38 being turned on.

Also, the pMOS transistor 41 is turned off, and the nMOS transistor 37 is turned on. Thus, the output of the inverter 25 becomes the high level. This leads to the nMOS transistor 36 and the pMOS transistor 40 being turned on.

In data writing, the write control signal WRITE becomes the high level. If the column address signal CA0 is set to the high level in the n-th cycle, for example, the output of the NAND circuit 30 becomes the low level. A latch circuit comprised of the inverter 22 and the inverter 23 latches the low level output of the NAND circuit 30 with the output of the inverter 22 being the high level.

Also, the output of the NAND circuit 32 becomes the high level. A latch circuit comprised of the inverter 26 and the inverter 27 latches the high level output of the NAND circuit 32 with the output of the inverter 26 being the low level.

Figure 10:
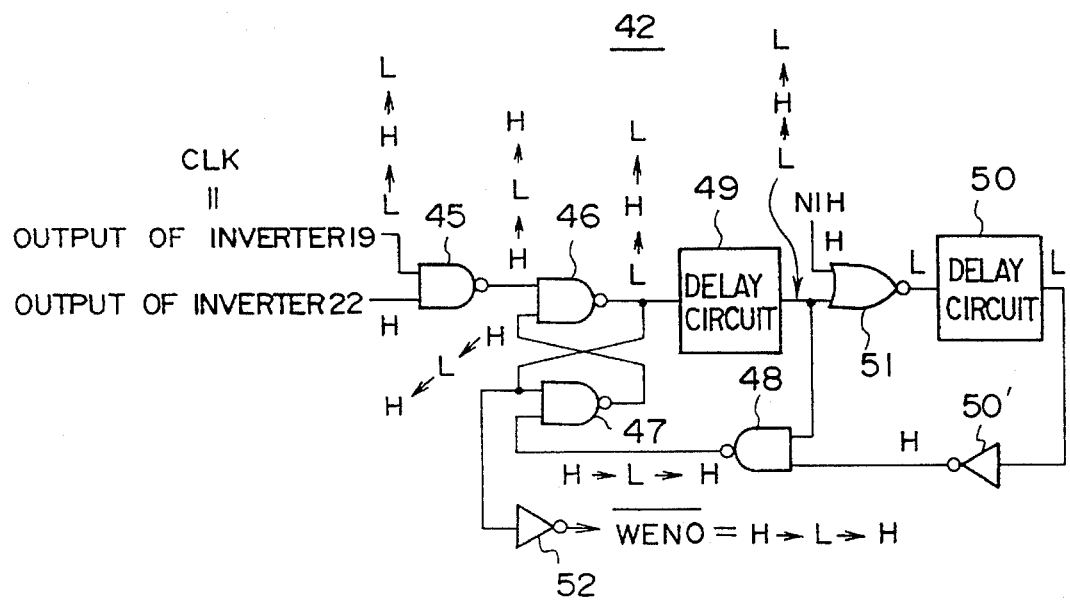
FIG. 10 is a circuit diagram for explaining an operation of the one-shot pulse generation circuit of FIG. 3 in the case of the low-speed SDRAM of the first embodiment.

As shown in FIG. 10, the output of the NOR circuit 51 is fixed to the low level in the one-shot pulse generation circuit 42, because the operation mode signal N1H is the high level. This leads to the outputs of the delay circuit 50 and the inverter 50' being fixed to the low level and the high level, respectively. Thus, the NAND circuit 48 serves as an inverter.

Then, in the n-th cycle mentioned above, the output of the inverter 19, i.e., the external clock signal CLK, becomes the low level. As a result, the outputs of the NAND circuit 45, the NAND circuit 46, and the NAND circuit 47 become the high level, the low level, and the high level, respectively. The output of the inverter 52, i.e., the write-amplifier-output control signal /WEN0, becomes the high level.

Then, the external clock signal CLK becomes the high level. As a result, the outputs of the NAND circuit 45, the NAND circuit 46, and the NAND circuit 47 become the low level, the high level, and the low level, respectively. The write-amplifier-output control signal /WEN0 becomes the low level.

Then, the external clock signal CLK becomes the low level again after a time period shorter than the delay time of the delay circuit 49. As a result, the output of the NAND circuit 45 is changed to the high level. However, the outputs of the NAND circuit 46 and the NAND circuit 47 remain at the high level and the low level, respectively. Also, the write-amplifier-output control signal /WEN0 stays at the low level.

After the passage of a time period equal to the delay time of the delay circuit 49, the outputs of the delay circuit 49, the NAND circuit 48, the NAND circuit 47, and the NAND circuit 46 become the high level, the low level, the high level, and the low level, respectively. Thus, the write-amplifier-output control signal /WEN0 becomes the high level.

Thus, the one-shot pulse generation circuit 42 outputs the write-amplifier-output control signal /WEN0 which has a reversed phase relationship with and the same frequency as that of the external clock signal CLK. Also, the write-amplifier-output control signal /WEN0 has a pulse width equal to the delay time of the delay circuit 49.

If the high level period of the external clock signal CLK is longer than the delay time of the delay circuit 48, the write-amplifier-output control signal /WEN0 has the same high level pulse width as that of the external clock signal CLK.

Figure 11:
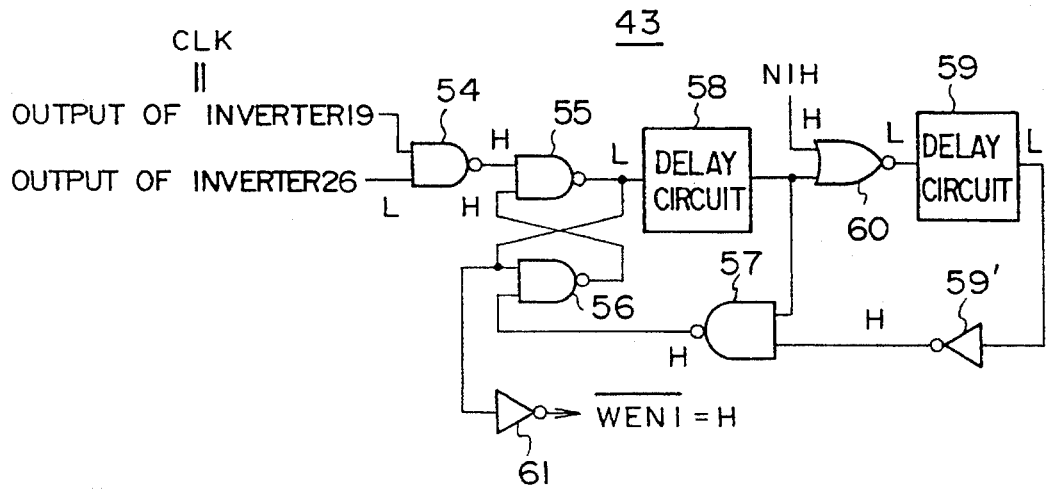
FIG. 11 is a circuit diagram for explaining an operation of the one-shot pulse generation circuit of FIG. 4 in the case of the low-speed SDRAM of the first embodiment.

In the one-shot pulse generation circuit 43, as shown in FIG. 11, the output of the NOR circuit 60 is fixed to the low level, because the operation mode signal N1H is the high level. This leads to the outputs of the delay circuit 59 and the inverter 59' being fixed to the low level and the high level, respectively. Thus, the NAND circuit 57 serves as an inverter.

Then, in the n-th cycle mentioned above, the output of the inverter 26 becomes the low level. As a result, the outputs of the NAND circuit 54, the NAND circuit 55, and the NAND circuit 56 become the high level, the low level, and the high level, respectively. The output of the inverter 61, i.e., the write-amplifier-output control signal /WEN1, becomes the high level.

Figure 12:
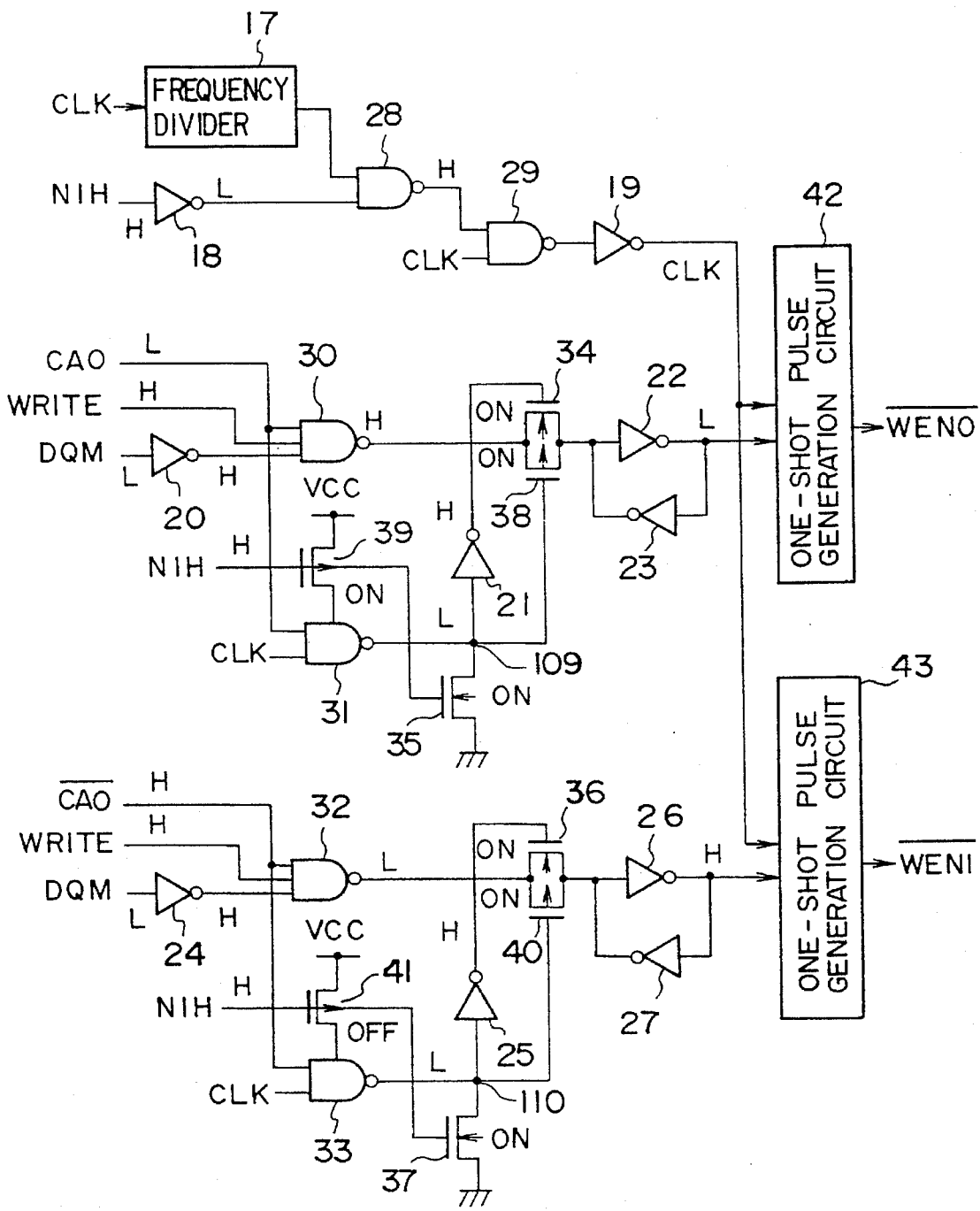
FIG. 12 is a circuit diagram for explaining an operation of the write-amplifier-output control-signal generation circuit of FIG. 2 in the case of the low-speed SDRAM of the first embodiment.

If the column address signal CA0 changes to the low level in the n+1-th cycle following the n-th cycle mentioned above, the output of the NAND circuit 30 of the write-amplifier-output control-signal generation circuit becomes the high level as shown in FIG. 12. A latch circuit comprised of the inverter 22 and the inverter 23 latches the high level output of the NAND circuit 30 with the output of the inverter 22 being the low level.

Also, the output of the NAND circuit 32 becomes the low level. A latch circuit comprised of the inverter 26 and the inverter 27 latches the low level output of the NAND circuit 32 with the output of the inverter 26 being the high level.

Figure 13:
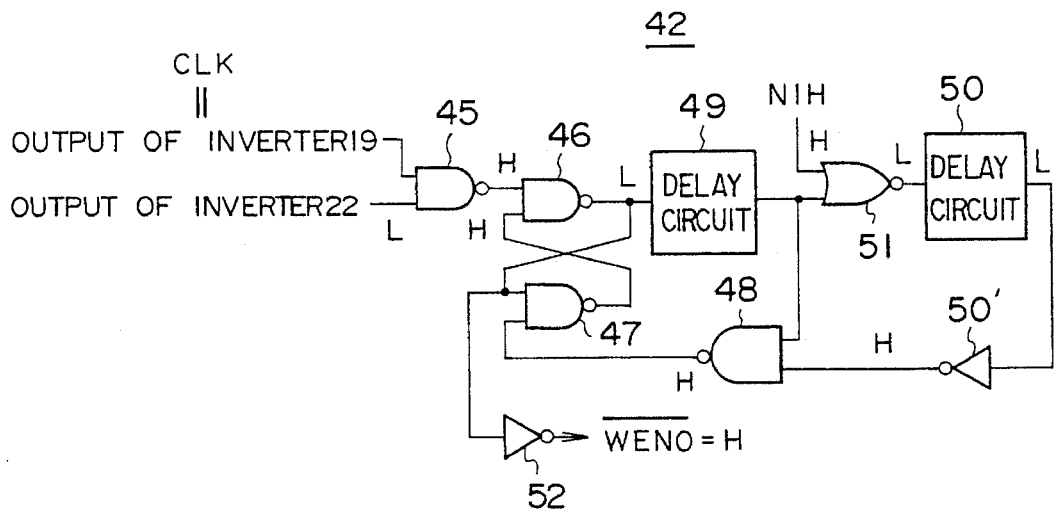
FIG. 13 is a circuit diagram for explaining an operation of the one-shot pulse generation circuit of FIG. 3 in the case of the low-speed SDRAM of the first embodiment.

Consequently, in the one-shot pulse generation circuit 42 shown in FIG. 13, the outputs of the NAND circuit 46, the NAND circuit 47, and the NAND circuit 48 become the high level, the low level, and the high level, respectively. The output of the inverter 52, i.e., the write-amplifier-output control signal /WEN0, becomes the high level.

Figure 14:
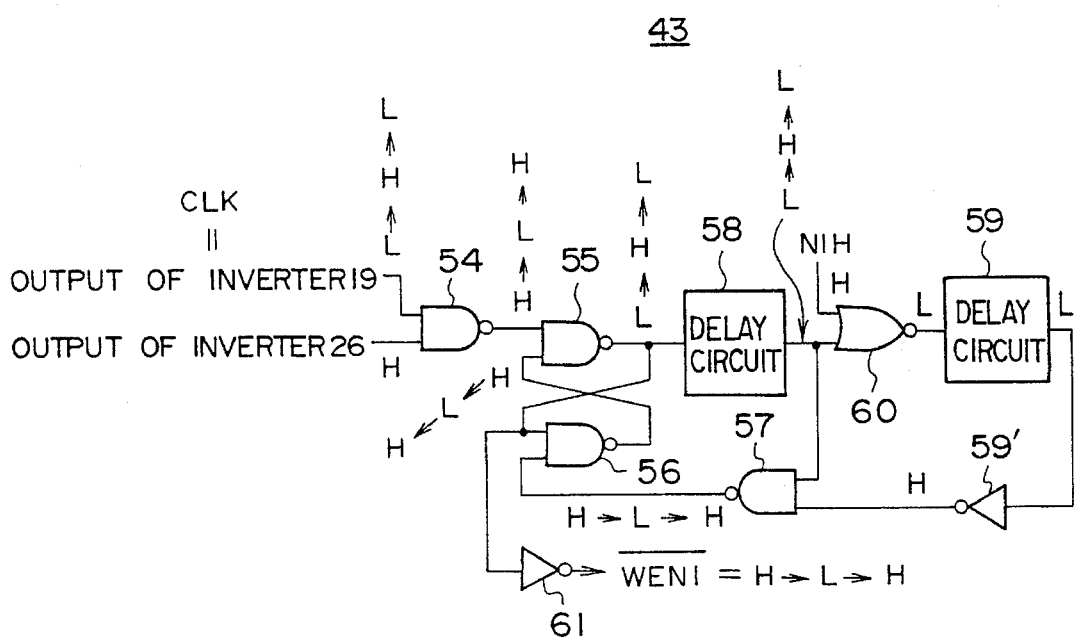
FIG. 14 is a circuit diagram for explaining an operation of the one-shot pulse generation circuit of FIG. 4 in the case of the low-speed SDRAM of the first embodiment.

In the one-shot pulse generation circuit 43 shown in FIG. 14, when the output of the inverter 19, i.e., the external clock signal CLK is the low level, the outputs of the NAND circuit 54, the NAND circuit 55, and the NAND circuit 56 become the high level, the low level, and the high level, respectively. The output of the inverter 61, i.e., the write-amplifier-output control signal /WEN1, becomes the high level.

Then, the external clock signal CLK becomes the high level. As a result, the outputs of the NAND circuit 54, the NAND circuit 55, and the NAND circuit 56 become the low level, the high level, and the low level, respectively. The write-amplifier-output control signal /WEN1 becomes the low level.

Then, the external clock signal CLK becomes the low level again after a time period shorter than the delay time of the delay circuit 58. As a result, the output of the NAND circuit 54 is changed to the high level. However, the outputs of the NAND circuit 55 and the NAND circuit 56 remain at the high level and the low level, respectively. Also, the write-amplifier-output control signal /WEN1 stays at the low level.

After the passage of a time period equal to the delay time of the delay circuit 58, the outputs of the delay circuit 58, the NAND circuit 57, the NAND circuit 56, and the NAND circuit 55 become the high level, the low level, the high level, and the low level, respectively. Thus, the write-amplifier-output control signal /WEN1 becomes the high level.

Thus, the one-shot pulse generation circuit 43 outputs the write-amplifier-output control signal /WEN1 which has a reversed phase relationship with and the same frequency as that of the external clock signal CLK. Also, the write-amplifier-output control signal /WEN1 has a pulse width equal to the delay time of the delay circuit 58.

If the high level period of the external clock signal CLK is longer than the delay time of the delay circuit 58, the write-amplifier-output control signal /WEN1 has the same high level pulse width as that of the external clock signal CLK.

Figure 15:
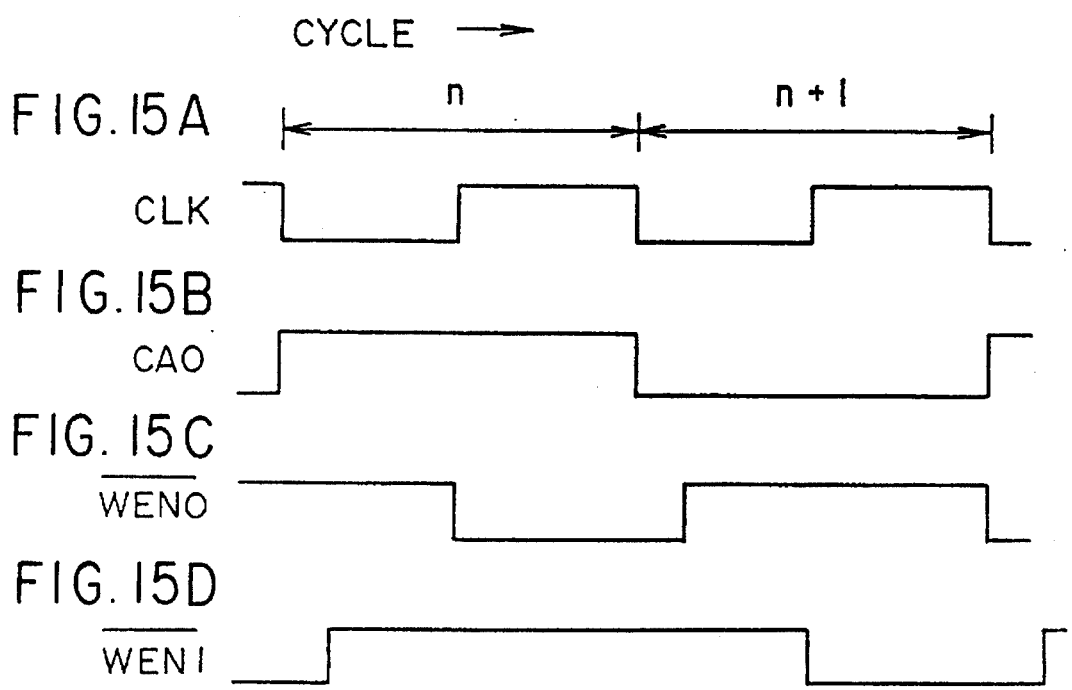
FIG. 15 is a time chart for explaining an operation of the write-amplifier-output control-signal generation circuit of FIG. 2 in the case of the low-speed SDRAM of the first embodiment.
Figure 16:
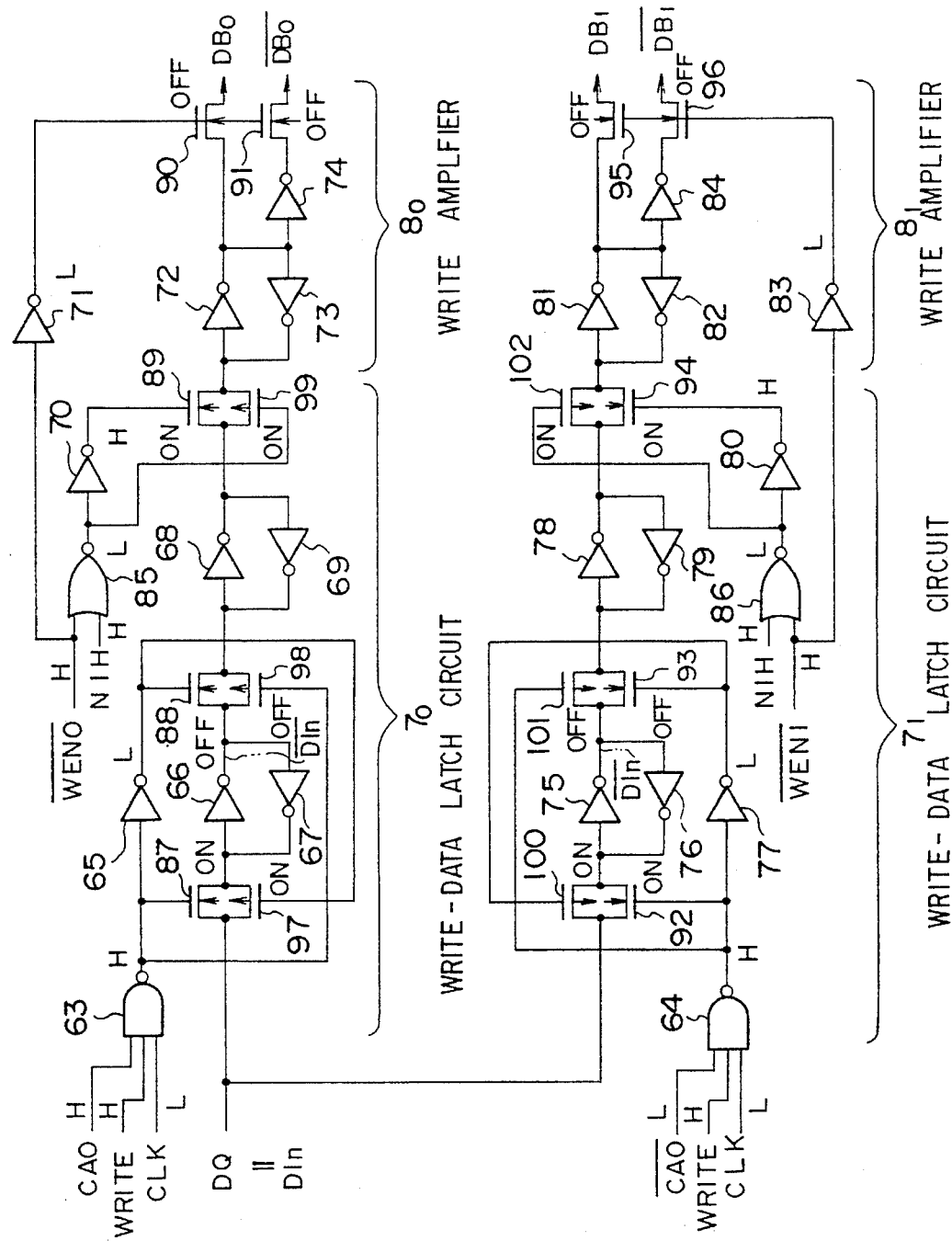
FIG. 16 is a circuit diagram for explaining operations of the write-data latch circuit and the write amplifier of FIG. 5 in the case of the low-speed SDRAM of the first embodiment.

FIG. 15 shows relations between the external clock signal CLK, the column address signal CA0, and the write-amplifier-output control signal /WEN0 and /WEN1. Those relations are observed in data writing described above, when the column address signal CA0 changes from the high level to the low level.

As a result, the write-data latch circuits $7_0$ and $7_1$ and the write amplifiers $8_0$ and $8_1$ operate as shown in FIG. 16 to FIG. 19.

In the write-data latch circuit $7_0$, the outputs of the NOR circuit 85 and the inverter 70 are the low level and the high level, respectively, because the operation mode signal N1H is the high level. This leads to the nMOS transistor 89 and the pMOS transistor 99 being turned on.

In the write-data latch circuit $7_1$, the outputs of the NOR circuit 86 and the inverter 80 are the low level and the high level, respectively, because the operation mode signal N1H is the high level. This leads to the nMOS transistor 94 and the pMOS transistor 102 being turned on.

In data writing, the write control signal WRITE becomes the high level. If the column address signal CA0 is set to the high level in the n-th cycle as described above while the external clock signal CLK is the low level, the output of the NAND circuit 63 becomes the high level. Thus, the output of the inverter 65 becomes the low level, which leads to the nMOS transistor 87 and the pMOS transistor 97 being turned on and to the nMOS transistor 88 and the pMOS transistor 98 being turned off.

In the write-data latch circuit $7_1$, the output of the NAND circuit 64 becomes the high level. Thus, the output of the inverter 77 becomes the low level, which leads to the nMOS transistor 92 and the pMOS transistor 100 being turned on and to the nMOS transistor 93 and the pMOS transistor 101 being turned off.

As a result, when the write data DQ is $DI_n$, the write data $DI_n$ is latched by a latch circuit comprised of the inverters 66 and 67, and, also, latched by a latch circuit comprised of the inverters 75 and 76. The outputs of the inverters 66 and 75 are $/DI_n$ and $/DI_n$, respectively.

At this point of time, both of the write-amplifier-output control signals /WEN0 and /WEN1 are the high level. Thus, in the write amplifier $8_0$, the output of the inverter 71 is the low level, and the nMOS transistors 90 and 91 are turned off. In the write amplifier $8_1$, the output of the inverter 83 is the low level, and the nMOS transistors 95 and 96 are turned off.

Figure 17:
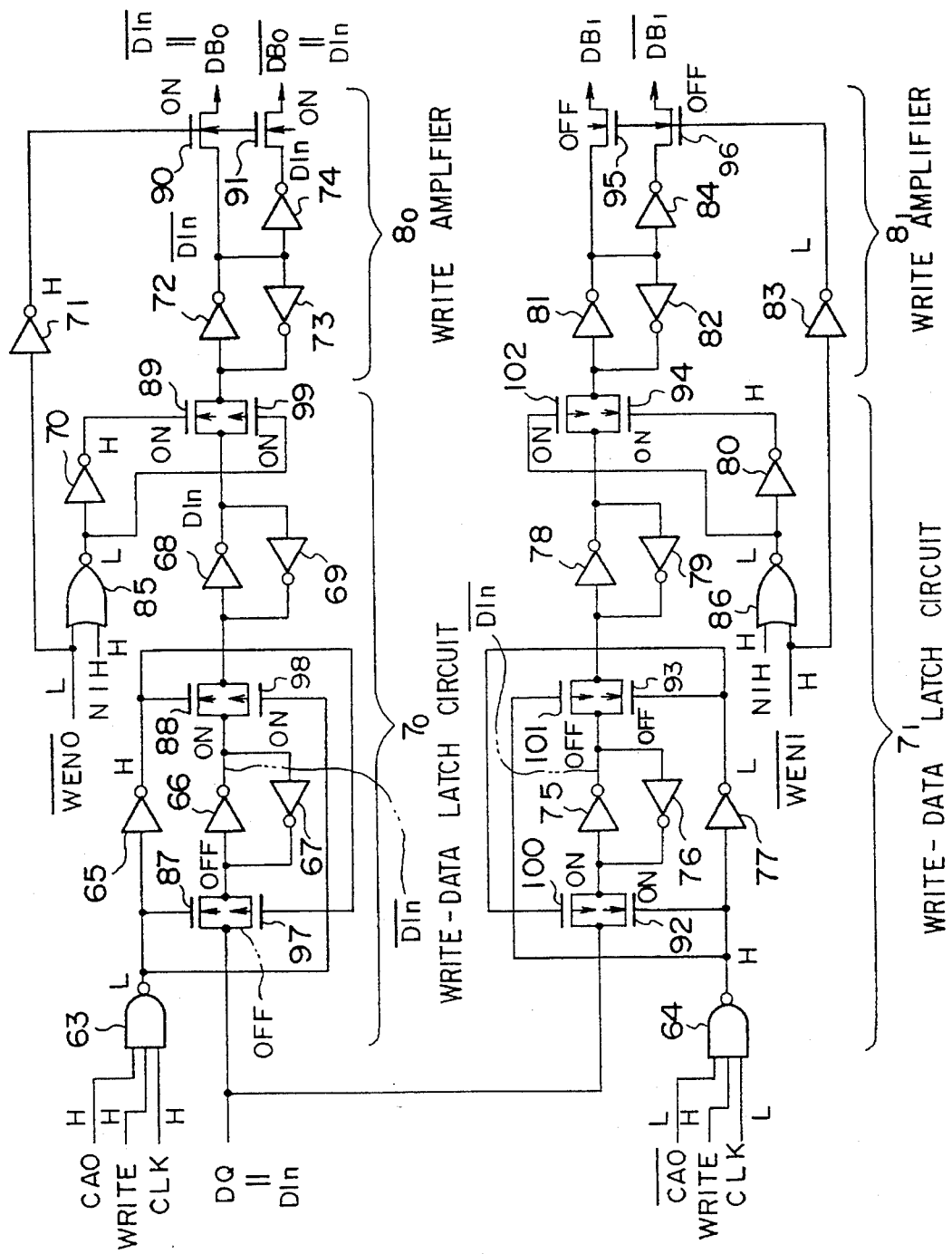
FIG. 17 is a circuit diagram for explaining operations of the write-data latch circuit and the write amplifier of FIG. 5 in the case of the low-speed SDRAM of the first embodiment.

When the external clock signal CLK changes to the high level as shown in FIG. 17, the output of the NAND circuit 63 becomes the low level in the write-data latch circuit $7_0$. Thus, the output of the inverter 65 becomes the high level, which leads to the nMOS transistor 87 and the pMOS transistor 97 being turned off and to the nMOS transistor 88 and the pMOS transistor 98 being turned on.

At this point of time, the write-amplifier-output control signal /WEN0 is the low level. Thus, the output of the inverter $7_1$ becomes the high level in the write amplifier $8_0$, and the nMOS transistors 90 and 91 are turned on.

As a result, a latch circuit comprised of the inverters 68 and 69 latches the reversed write data $/DI_n$ with the output of the inverter 68 being $DI_n$. Thus, the latch circuit comprised of the inverters 72 and 73 latches the write data $DI_n$ with the output of the inverter 72 being $/DI_n$. This leads to the output of the inverter 74 being $DI_n$, so that the data bus lines $DB_0$ and $/DB_0$ become $/DI_n$ and $DI_n$, respectively.

In the write-data latch circuit $7_1$, the output of the NAND circuit 64 stays at the high level. Thus, the output of the inverter 77 stays at the low level, which leads to the nMOS transistor 92 and the pMOS transistor 100 remaining turned on and to the nMOS transistor 93 and the pMOS transistor 101 remaining turned off.

At this point of time, the write-amplifier-output control signal /WEN1 remains at the high level. Thus, the output of the inverter 83 stays at the low level in the write amplifier $8_1$, and the nMOS transistors 95 and 96 remain turned off.

Figure 18:
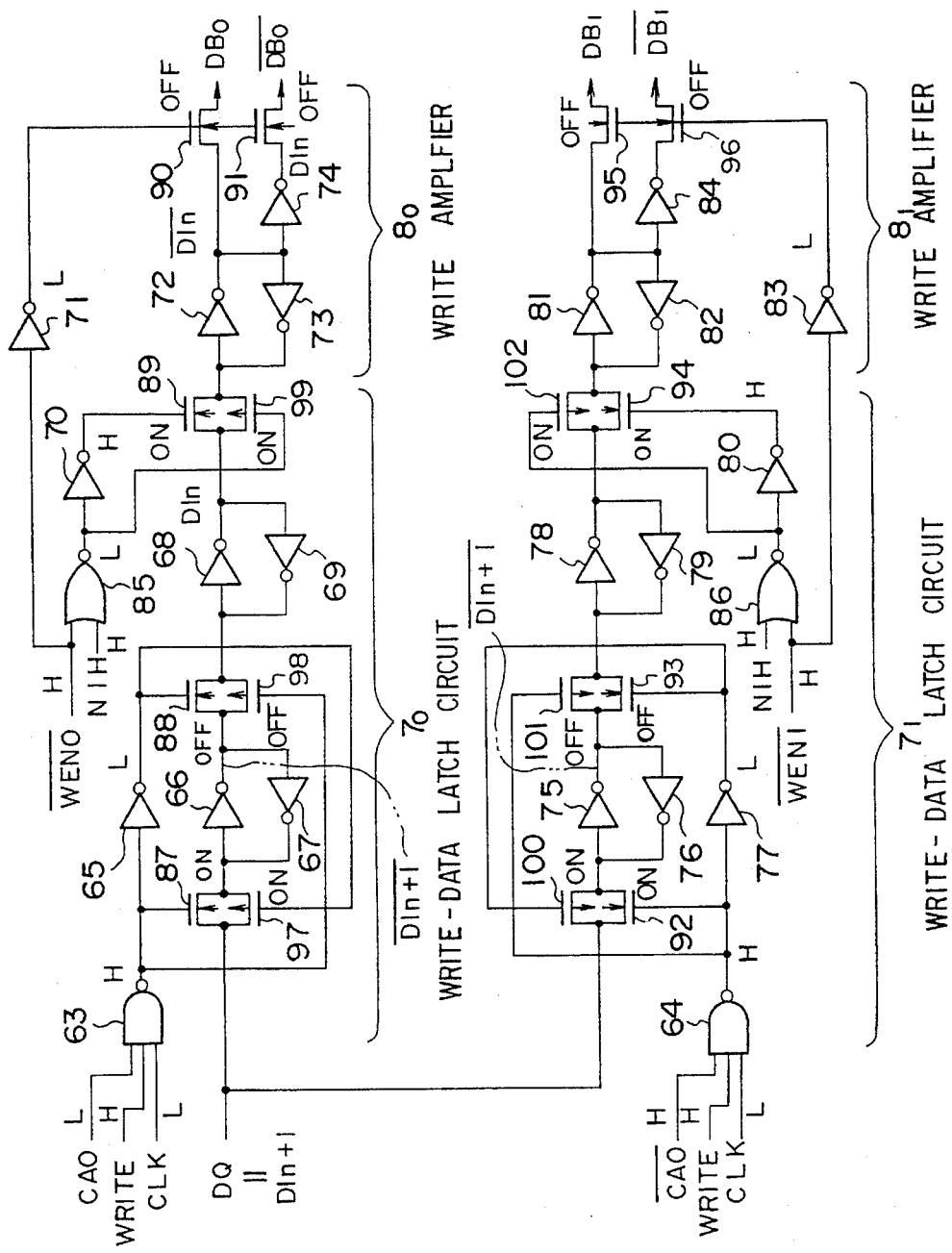
FIG. 18 is a circuit diagram for explaining operations of the write-data latch circuit and the write amplifier of FIG. 5 in the case of the low-speed SDRAM of the first embodiment.

Then, the cycle becomes the n+1-th cycle. As shown in FIG. 18, if the column address signal CA0 becomes the low level, the output of the NAND circuit 63 becomes the high level in the write-data latch circuit $7_0$. This is the case while the external clock signal CLK is the low level. The output of the inverter 65 becomes the low level, which leads to the nMOS transistor 87 and the pMOS transistor 97 being turned on and to the nMOS transistor 88 and the pMOS transistor 98 being turned off.

At this time, the write-amplifier-output control signal /WEN0 becomes the high level, so that the output of the inverter 71 becomes the low level. Thus, the nMOS transistors 90 and 91 are turned off.

As a result, when the write data DQ is $DI_{n+1}$, the write data $DI_{n+1}$ is latched by a latch circuit comprised of the inverters 66 and 67 with the output of the inverter 66 being $/DI_{n+1}$.

In the write-data latch circuit $7_1$, the output of the NAND circuit 64 becomes the high level. The output of the inverter 77 becomes the low level, which leads to the nMOS transistor 92 and the pMOS transistor 100 being turned on and to the nMOS transistor 93 and the pMOS transistor 101 being turned off.

As a result, when the write data DQ is $DI_{n+1}$, the write data $DI_{n+1}$ is latched by a latch circuit comprised of the inverters 75 and 76 with the output of the inverter 75 being $/DI_{n+1}$.

At this point of time, the write-amplifier-output control signal /WEN1 stays at the high level, so that the output of the inverter 83 remains at the low level. Thus, the nMOS transistors 95 and 96 remain turned off.

Figure 19:
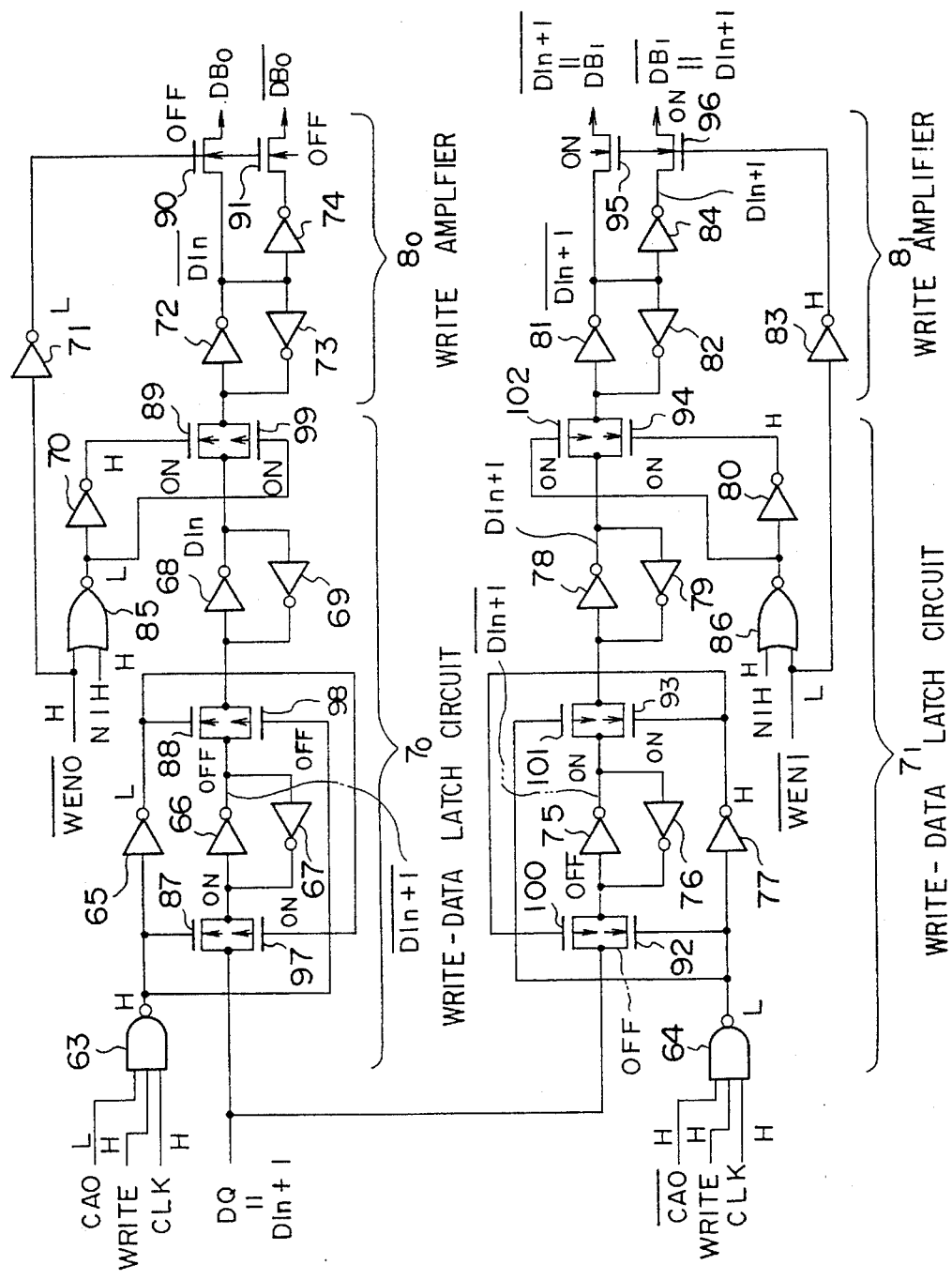
FIG. 19 is a circuit diagram for explaining operations of the write-data latch circuit and the write amplifier of FIG. 5 in the case of the low-speed SDRAM of the first embodiment.

When the external clock signal CLK changes to the high level as shown in FIG. 19, the output of the NAND circuit 63 stays at the high level in the write-data latch circuit $7_0$. Thus, the output of the inverter 65 stays at the low level, which leads to the nMOS transistor 87 and the pMOS transistor 97 remaining turned on and to the nMOS transistor 88 and the pMOS transistor 98 remaining turned off.

At this point of time, the write-amplifier-output control signal /WEN0 remains at the high level. Thus, the output of the inverter 71 remains at the low level in the write amplifier $8_0$, and the nMOS transistors 90 and 91 remain turned off.

In the write-data latch circuit $7_1$, the output of the NAND circuit 64 becomes the low level. The output of the inverter 77 becomes the high level, which leads to the nMOS transistor 92 and the pMOS transistor 100 being turned off and to the nMOS transistor 93 and the pMOS transistor 101 being turned on.

At this point of time, the write-amplifier-output control signal /WEN1 becomes the low level, so that the output of the inverter 83 becomes the high level. Thus, the nMOS transistors 95 and 96 are turned on.

As a result, the latch circuit comprised of the inverters 78 and 79 latches the reversed write data $/DI_{n+1}$ with the output of the inverter 78 being $DI_{n+1}$. Thus, the latch circuit comprised of the inverters 81 and 82 latches the write data $DI_{n+1}$ with the output of the inverter 81 being $/DI_{n+1}$. This leads to the output of the inverter 84 being $DI_{n+1}$, so that the data bus lines $DB_1$ and $/DB_1$ become $/DI_{n+1}$ and $DI_{n+1}$, respectively.

FIGS. 20A to 20G show a case in which consecutive data writing is carried out with regard to the column addresses 0, 1, 16, 17, 31, and 38.

Figure 20:
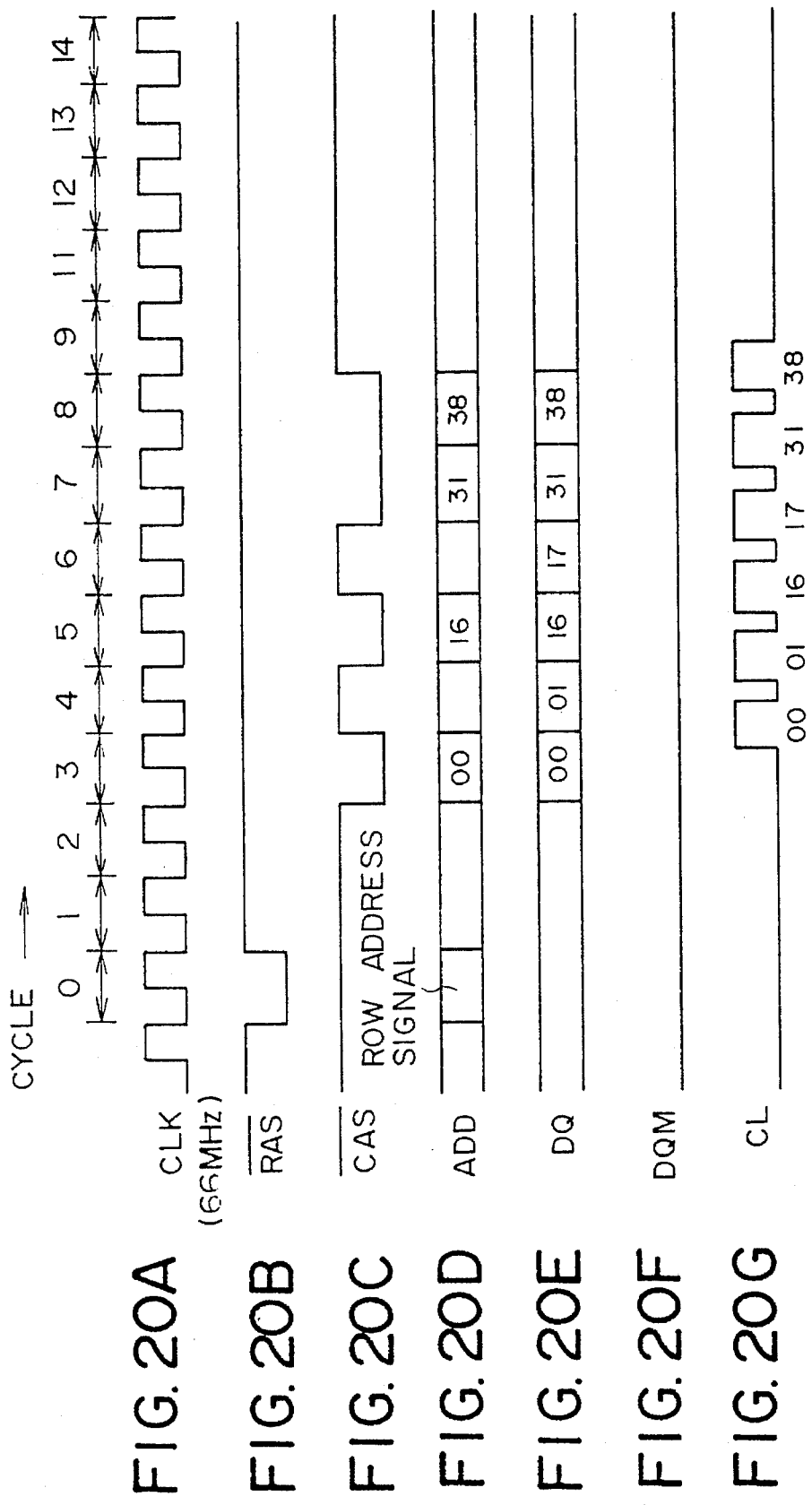
FIGS. 20A to 20G are time charts for explaining a writing operation of the low-speed SDRAM of the first embodiment.

FIG. 20A shows the external clock signal CLK, FIG. 20B shows the row address strobe signal /RAS, FIG. 20C shows the column address strobe signal /CAS, FIG. 20D shows the address signal ADD, FIG. 20E shows the input data DQ, FIG. 20F shows the data mask signal DQM, and FIG. 20G shows the column selection signal CL.

In FIG. 20D to FIG. 20F, 00, 01, 16, 17, 31, and 38 indicate the column addresses 0, 1, 16, 17, 31, and 38, respectively.

At a 0th cycle, when the row address strobe signal /RAS is changed to the low level, an address signal provided at the address signal input node is latched as a row address signal. This data latch is carried out at a positive edge of the external clock signal CLK. The row address signal is decoded to select a word line.

The column address strobe signal /CAS is changed to the low level at a third cycle, for example. Then, at a positive edge of the external clock signal CLK, the column address signal indicating the 0th column address at the address input node is latched.

Also, at the same positive edge of the external clock signal CLK, data provided at the data input/output node is latched by the write-data latch circuit $7_0$. This data is the data which is to be written into the column address 0.

During a high level period of the external clock signal CLK, the data latched in the write-data latch circuit $7_0$ is written into the column address 0.

Then, at a fourth cycle, the column address strobe signal /CAS is changed to the high level. At a positive edge of the external clock signal CLK, data provided at the data input/output node to be written into the column address 1 is latched by the write-data latch circuit $7_1$.

During a high level period of the external clock signal CLK, the data latched in the write-data latch circuit $7_1$ is written into the column address 1.

At a fifth cycle, the column address strobe signal /CAS is changed to the low level. Then, at a positive edge of the external clock signal CLK, a column address signal indicating the column address 16 at the address signal input node is latched.

Also, at the same positive edge of the external clock signal CLK, data provided at the data input/output node to be written into the column address 16 is latched by the write-data latch circuit $7_0$.

During a high level period of the external clock signal CLK, the data latched in the write-data latch circuit $7_0$ is written into the column address 16.

At a sixth cycle, the column address strobe signal /CAS is changed to the high level. At a positive edge of the external clock signal CLK, data provided at the data input/output node to be written into the column address 17 is latched by the write-data latch circuit $7_1$.

During a high level period of the external clock signal CLK, the data latched in the write-data latch circuit $7_1$ is written into the column address 17.

At a seventh cycle, the column address strobe signal /CAS is changed to the low level. At a positive edge of the external clock signal CLK, data provided at the data input/output node to be written into the column address 31 is latched by the write-data latch circuit $7_1$.

During a high level period of the external clock signal CLK, the data latched in the write-data latch circuit $7_1$ is written into the column address 31.

At an eighth cycle, the column address strobe signal /CAS remains to the low level. At a positive edge of the external clock signal CLK, data provided at the data input/output node to be written into the column address 38 is latched by the write-data latch circuit $7_0$.

During a high level period of the external clock signal CLK, the data latched in the write-data latch circuit $7_{01}$ is written into the column address 38.

In the manner as described above, the low-speed SDRAM produced according to the first embodiment of the present invention can carry out consecutive data writing operations for column addresses having the same row address at a low clock rate such as the 66 MHz of the external clock signal CLK.

Figure 21:
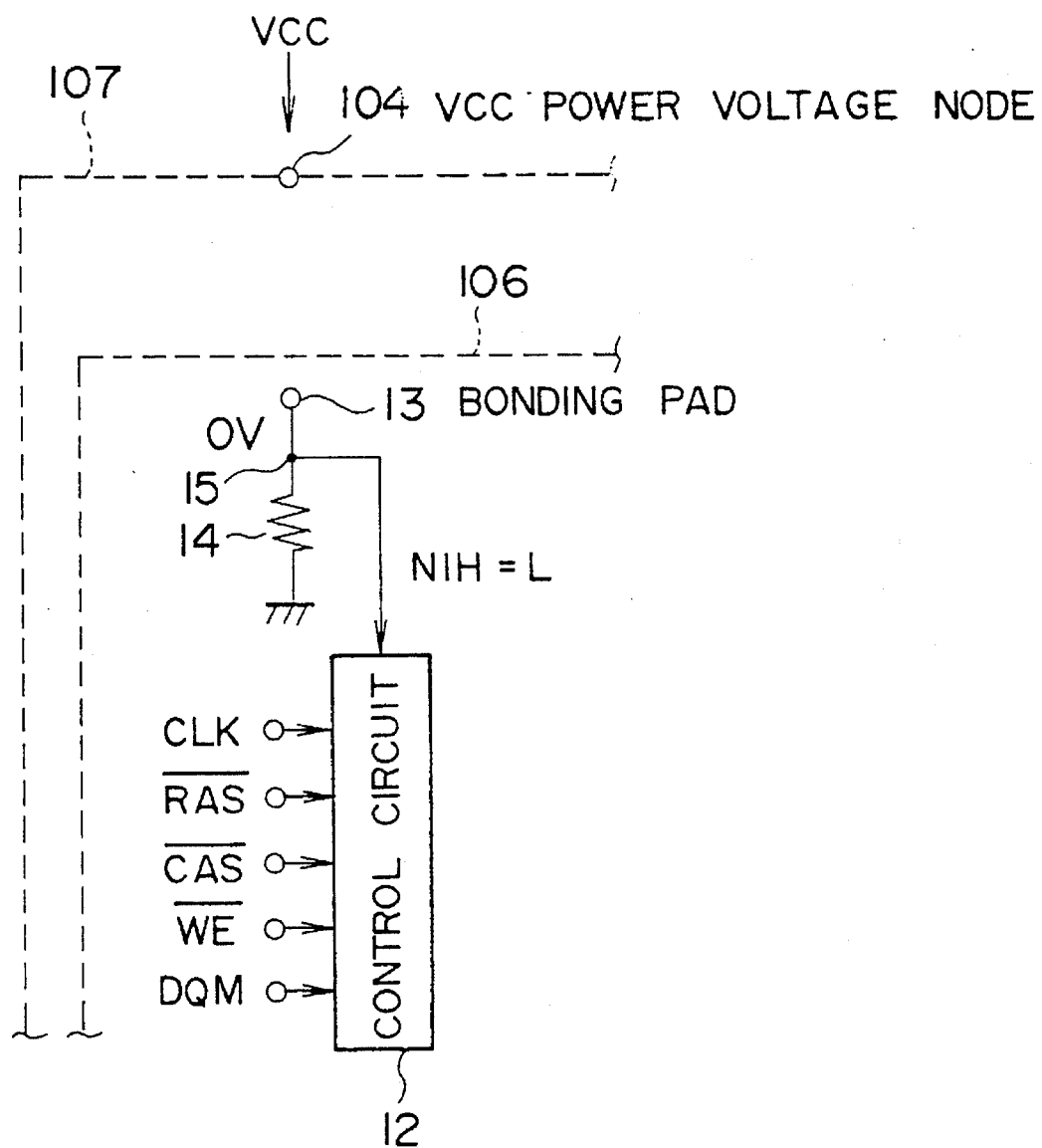
FIG. 21 is a circuit diagram for explaining an operation of the high-speed SDRAM of the first embodiment.

On the other hand, when producing a high-speed SDRAM shown in FIG. 7, the bonding pad 13 is not connected to the VCC power node 104. In this case, as shown in FIG. 21, the voltage level of the node 15 becomes the ground level 0 V, so that the operation mode signal N1H becomes the low level.

Figure 22:
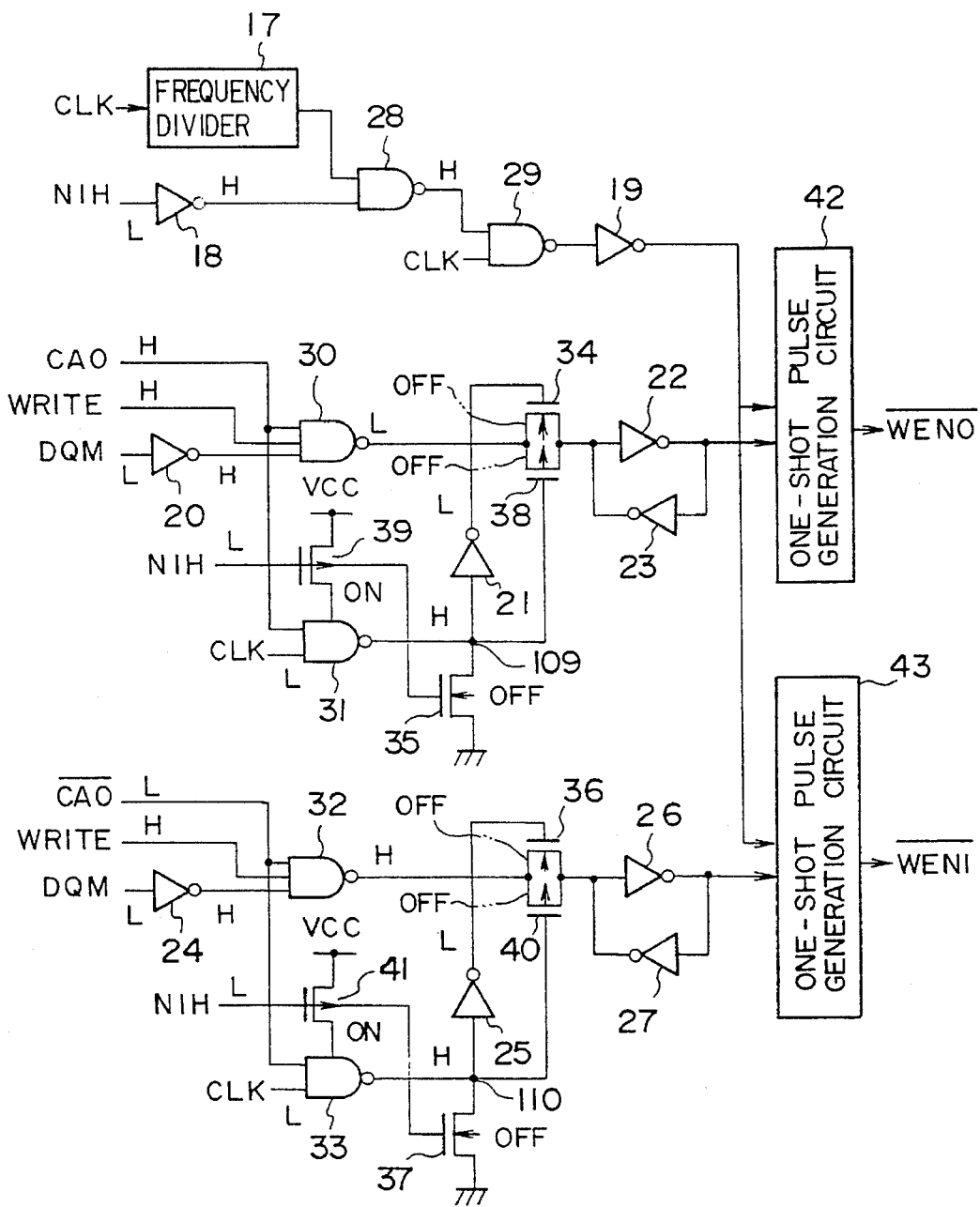
FIG. 22 is a circuit diagram for explaining an operation of the write-amplifier-output control-signal generation circuit of FIG. 2 in the case of the high-speed SDRAM of the first embodiment.
Figure 23:
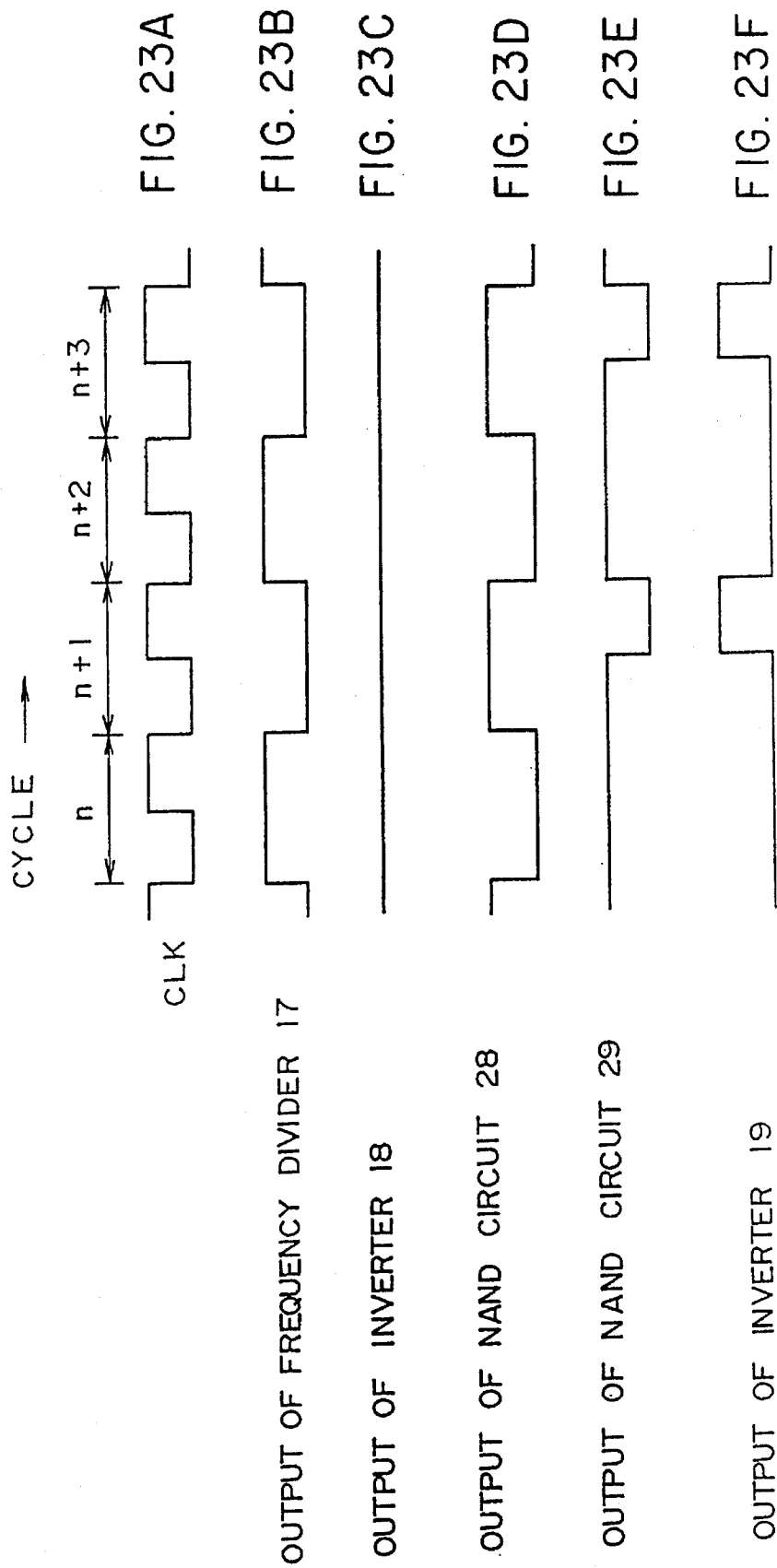
FIG. 23 is a time chart for explaining an operation of the write-amplifier-output control-signal generation circuit of FIG. 2 in the case of the high-speed SDRAM of the first embodiment.

As a result, as shown in FIG. 22, the output of the inverter 18 of the write-amplifier-output control-signal generation circuit becomes the high level. Thus, the external clock signal CLK, the output of the frequency divider 17, the output of the inverter 18, the output of the NAND circuit 28, the output of the NAND circuit 29, and the output of the inverter 19 as shown in FIG. 23 are obtained.

With the external clock signal CLK of such frequency as 125 MHz, the inverter 19 generates an internal clock signal which has half the frequency and the same high-level pulse width as that of the external clock signal CLK. This internal clock signal is then supplied to the one-shot pulse generation circuits 42 and 43.

With reference to FIG. 22, since the operation mode signal N1H is at the low level, the pMOS transistor 39, the nMOS transistor 35, the pMOS transistor 41, and the nMOS transistor 37 are turned on, off, on, and off, respectively.

The write control signal WRITE becomes the high level at the time of data writing. When the column address signal CA0 is changed to the high level at an n-th cycle, for example, the outputs of the NAND circuits 30 and 32 become the low level and the high level, respectively.

In this case, when the external clock signal CLK is the low level, the outputs of the NAND circuit 31 and the inverter 21 become the high level and the low level, respectively, with the nMOS transistor 34 and the pMOS transistor 38 being turned off.

Also, the outputs of the NAND circuit 33 and the inverter 25 become the high level and the low level respectively, with the nMOS transistor 36 and the pMOS transistor 40 being turned off.

As a result, the latch circuit comprised of the inverters 22 and 23 and the latch circuit comprised of the inverters 26 and 27 remain keeping data which have been latched at the previous cycle.

Figure 24:
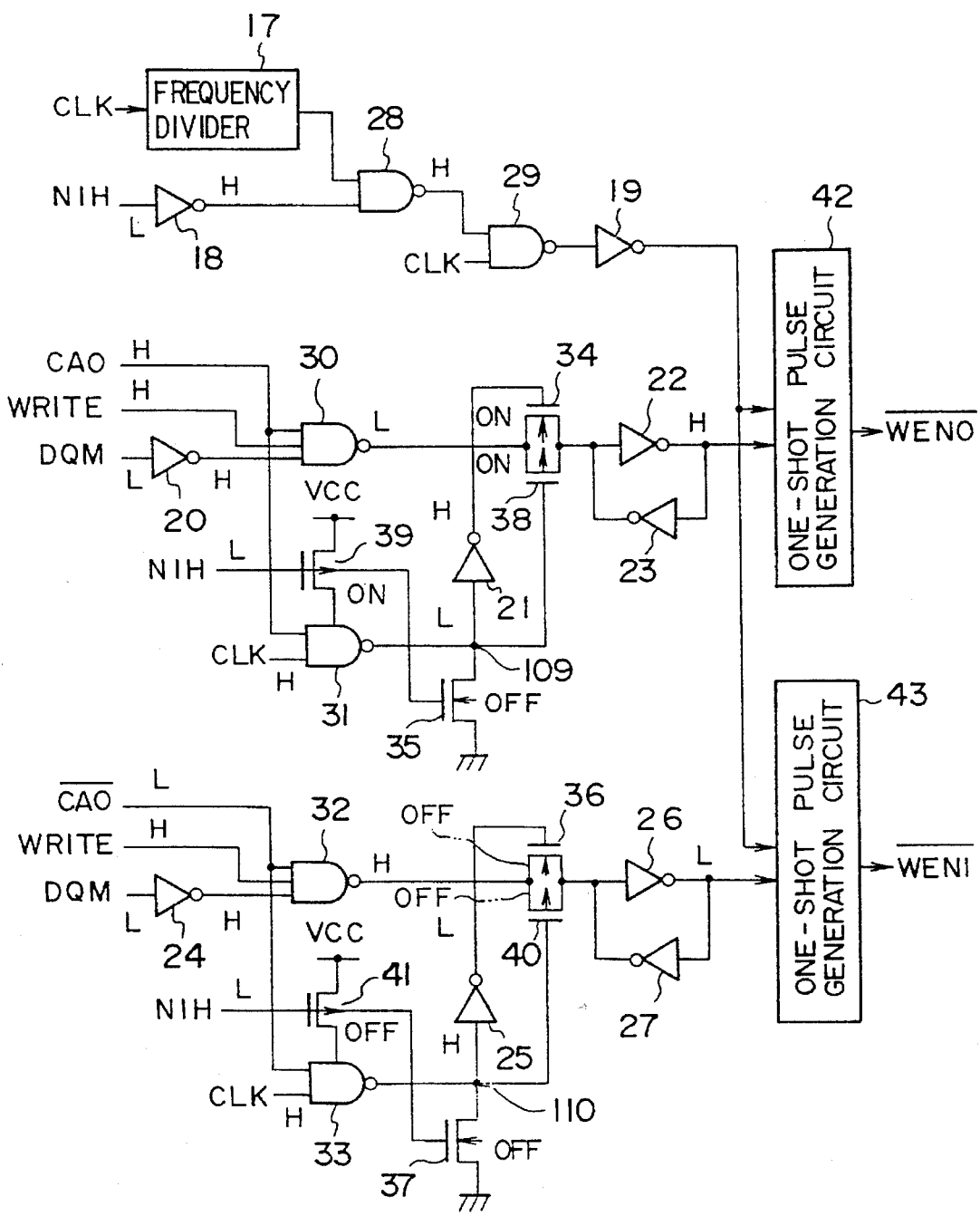
FIG. 24 is a circuit diagram for explaining an operation of the write-amplifier-output control-signal generation circuit of FIG. 2 in the case of the high-speed SDRAM of the first embodiment.

When the external clock signal CLK is changed to the high level as shown in FIG. 24, the outputs of the NAND circuit 31 and the inverter 21 become the low level and the high level, respectively, with the nMOS transistor 34 and the pMOS transistor 38 being turned on.

As a result, the latch circuit comprised of the inverters 22 and 23 latches the low level output of the NAND circuit 30. Thus, the output of the inverter 22 becomes the high level.

On the other hand, the outputs of the NAND circuit 33 and the inverter 25 remain at the high level and the low level, respectively, with the nMOS transistor 36 and the pMOS transistor 40 remaining turned off.

Figure 25:
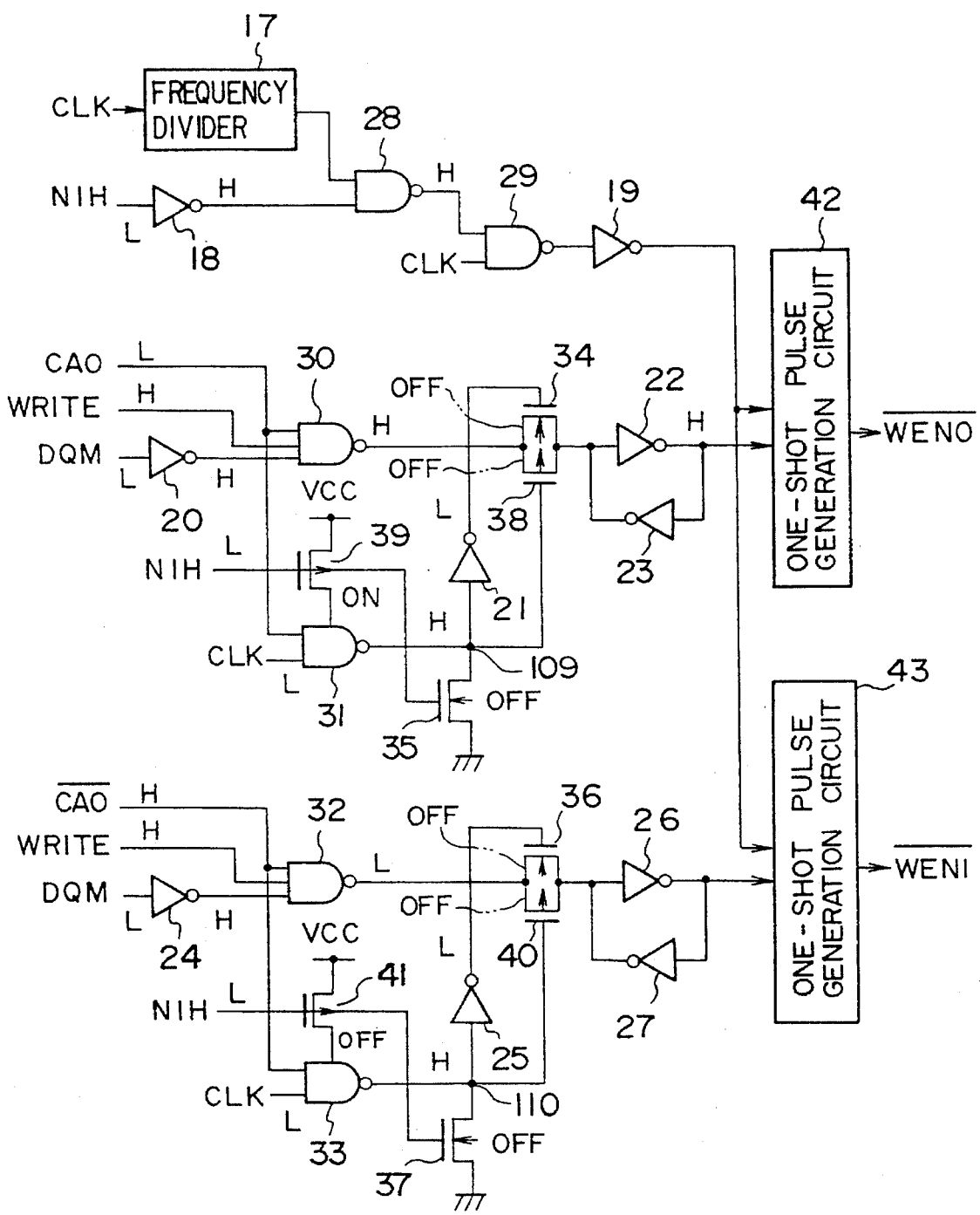
FIG. 25 is a circuit diagram for explaining an operation of the write-amplifier-output control-signal generation circuit of FIG. 2 in the case of the high-speed SDRAM of the first embodiment.

At a n+1-th cycle, as shown in FIG. 25, the column address signal CA0 is changed to the low level. Thus, the outputs of the NAND circuits 30 and 32 become the high level and the low level, respectively.

In this case, when the external clock signal CLK is the low level, the outputs of the NAND circuit 31 and the inverter 21 become the high level and the low level, respectively, with the nMOS transistor 34 and the pMOS transistor 38 remaining turned off.

Also, the outputs of the NAND circuit 33 and the inverter 25 become the high level and the low level, respectively, with the nMOS transistor 36 and the pMOS transistor 40 remaining turned off.

As a result, the latch circuit comprised of the inverters 22 and 23 remain keeping the low level which has been latched at the n-th cycle. Thus, the output of the inverter 22 stays at the high level.

Figure 26:
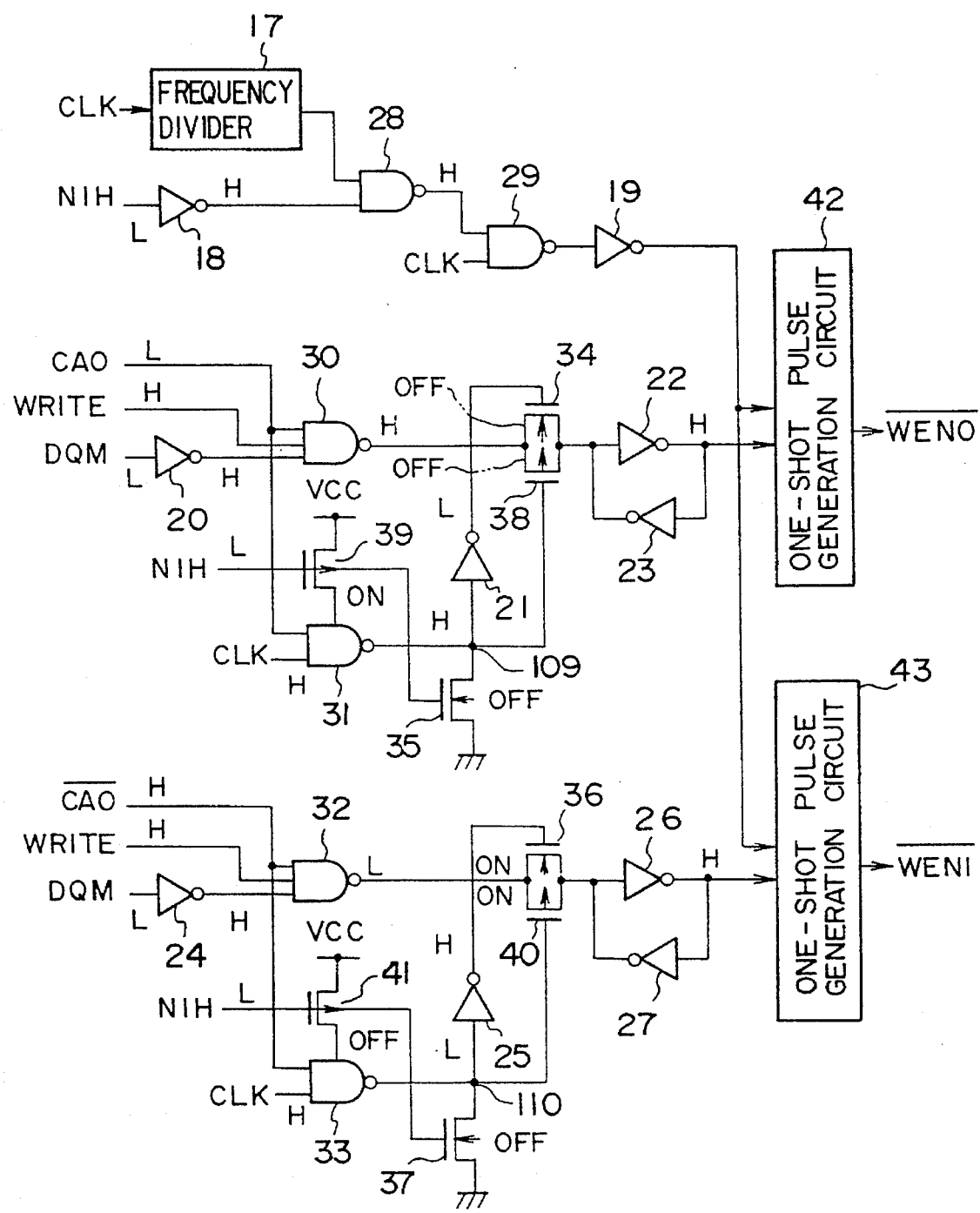
FIG. 26 is a circuit diagram for explaining an operation of the write-amplifier-output control-signal generation circuit of FIG. 2 in the case of the high-speed SDRAM of the first embodiment.

When the external clock signal CLK is changed to the high level as shown in FIG. 26, the outputs of the NAND circuit 33 and the inverter 25 become the low level and the high level, respectively, with the nMOS transistor 36 and the pMOS transistor 40 being turned on.

As a result, the latch circuit comprised of the inverters 26 and 27 latches the low level output of the NAND circuit 32. Thus, the output of the inverter 26 remains at the high level.

On the other hand, the outputs of the NAND circuit 31 and the inverter 21 remain at the high level and the low level, respectively, with the nMOS transistor 34 and the pMOS transistor 38 remaining turned off.

As a result, the latch circuit comprised of the inverters 22 and 23 remain keeping the low level which has been latched at the n-th cycle. Thus, the output of the inverter 22 stays at the high level.

As described above, when the data mask signal DQM is the low level at the n-th cycle, the output of the inverter 22 becomes the high level during the high-level period of the external clock signal CLK in the n-th cycle and during the period of the n+1-th cycle.

When the data mask signal DQM is the low level at the n+1-th cycle, the output of the inverter 26 becomes the high level during the high-level period of the external clock signal CLK in the n+1-th cycle and during the period of the n+2-th cycle.

On the other hand, when the data mask signal DQM is the high level at the n-th cycle, the output of the inverter 22 becomes the low level during the high-level period of the external clock signal CLK in the n-th cycle and during the period of the n+1-th cycle.

When the data mask signal DQM is the high level at the n+1-th cycle, the output of the inverter 26 becomes the low level during the high-level period of the external clock signal CLK in the n+1-th cycle and during the period of the n+2-th cycle.

Figure 27:
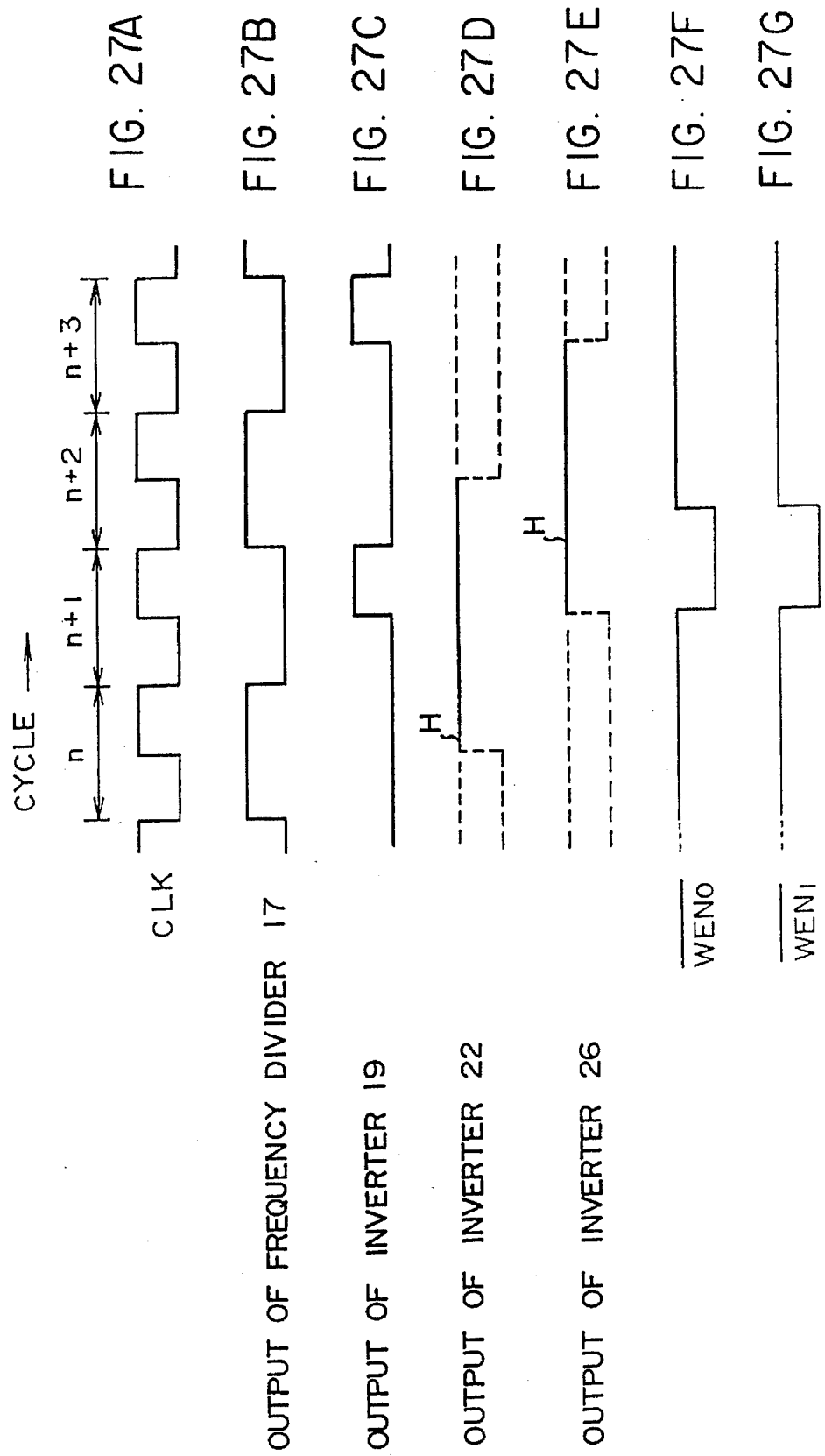
FIG. 27 is a time chart for explaining the one-shot pulse generation circuits of the high-speed SDRAM of the first embodiment.
Figure 28:
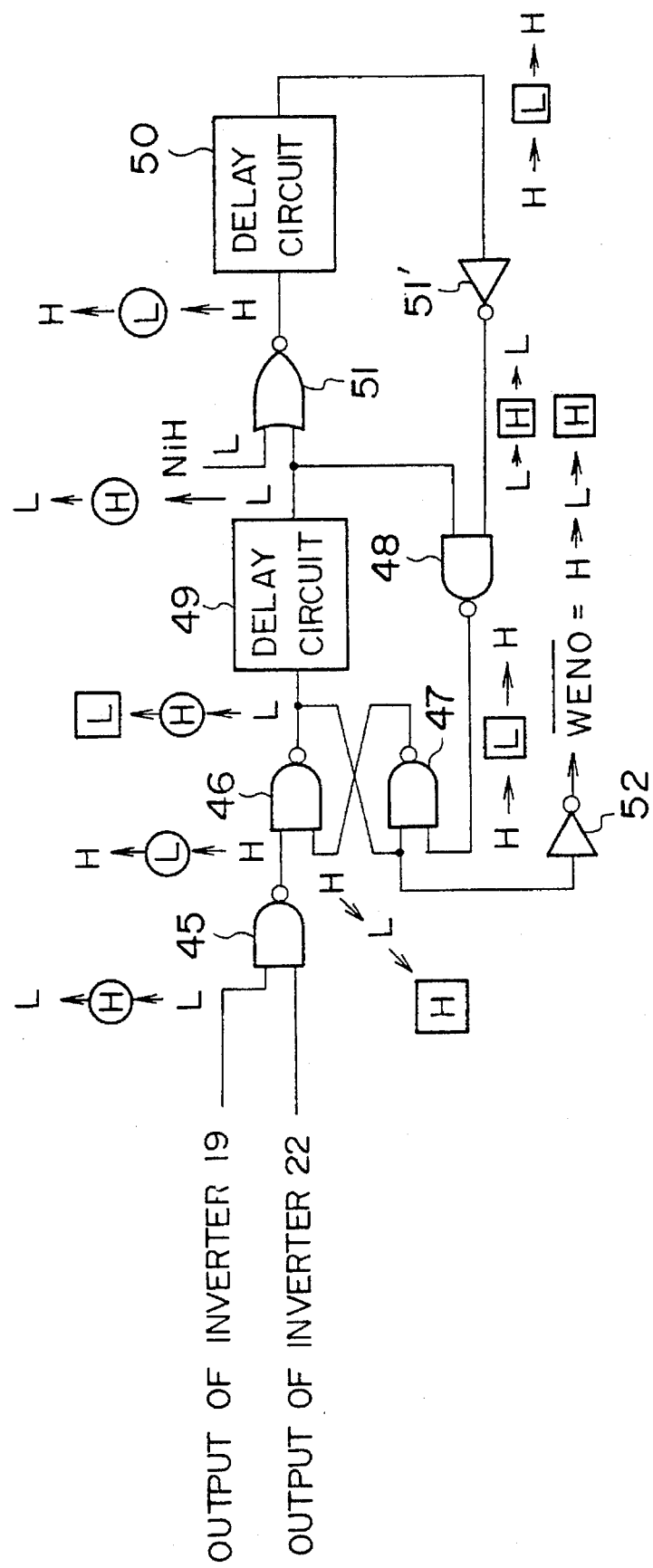
FIG. 28 is a circuit diagram for explaining an operation of the one-shot pulse generation circuit of FIG. 3 in the case of the high-speed SDRAM of the first embodiment.

FIG. 27 is a time chart for explaining an operation of the one-shot pulse generation circuits 42 and 43. FIG. 28 is a circuit diagram for explaining an operation of the one-shot pulse generation circuit 42.

In the one-shot pulse generation circuit 42, the output of the inverter 19 is at the low level during the period of the n-th cycle and during the low level period of the external clock signal CLK in the n+1-th period, as shown in FIG. 27. During those periods, as shown in FIG. 28, the outputs of the NAND circuit 45, the NAND circuit 46, and the NAND circuit 47 are at the high level, the low level, and the high level, respectively. Also, the output of the inverter 52 i.e., the write-amplifier-output control-signal /WEN0, becomes the high level.

At this point of time, the outputs of the delay circuit 49, the NOR circuit 51, the delay circuit 50, and the inverter 51' are the low level, the high level, the high level, and the low level, respectively.

When the external clock signal CLK becomes the high level as shown in FIG. 27, the outputs of the inverter 19 and the inverter 22 become the high level. Thus, as shown in FIG. 28, the outputs of the NAND circuits 45 and 46 become the low level and the high level, respectively. Also, the write-amplifier-output control signal /WEN0 becomes the low level.

Then, the output of the delay circuit 49 becomes the high level (shown by a circle in FIG. 28). However, the output of the inverter 51' remains at the low level, so that the output of the NAND circuit 48 stays at the high level. Thus, the write-amplifier-output control signal /WEN0 remains at the low level.

When the output of the delay circuit 49 becomes the high level, the output of the NOR circuit 52 becomes the low level. After the passage of a predetermined period of time, as shown by rectangles in FIG. 28, the outputs of the delay circuit 50, the inverter 51', the NAND circuit 48, the NAND circuit 47, and the NAND circuit 46 become the low level, the high level, the low level, the high level, and the low level, respectively. Thus, the write-amplifier-output control signal /WEN0 becomes the high level.

After the passage of a predetermined period of time, the output of the delay circuit 49 becomes the low level so that the output of the NAND circuit 48 becomes the high level. However, the outputs of the NAND circuits 47 and 46 remain unchanged. Thus, the write-amplifier-output control signal /WEN0 is not changed either.

When the output of the delay circuit 49 becomes the low level, the output of the NOR circuit 51 becomes the high level. Then, after a predetermined period of time, the outputs of the delay circuit 50 and the inverter 51' become the high level and the low level, respectively. Since the output of the NAND circuit 48 has been changed to the high level already, however, the outputs of the NAND circuit 47 and 46 are not changed. Thus, the write-amplifier-output control signal /WEN0 is not changed either.

As a result, the write-amplifier-output control signal /WEN0 ends up having a pulse width equal to the sum of each of the delay times of the delay circuits 49 and 50.

Also, since the output of the inverter 26 becomes the high level while the output of the inverter 19 is at the high level as shown in FIG. 27, the one-shot pulse generation circuit 43 operates in the same manner as does the one-shot pulse generation circuit 42. Thus, the one-shot pulse generation circuit 43 has a pulse width equal to the sum of each of the delay times of the delay circuit 58 and 59.

As a result, the write-data latch circuits $7_0$ and $7_1$ and the write amplifiers $8_0$ and $8_1$ operate as shown in FIG. 29 to FIG. 33.

Figure 29:
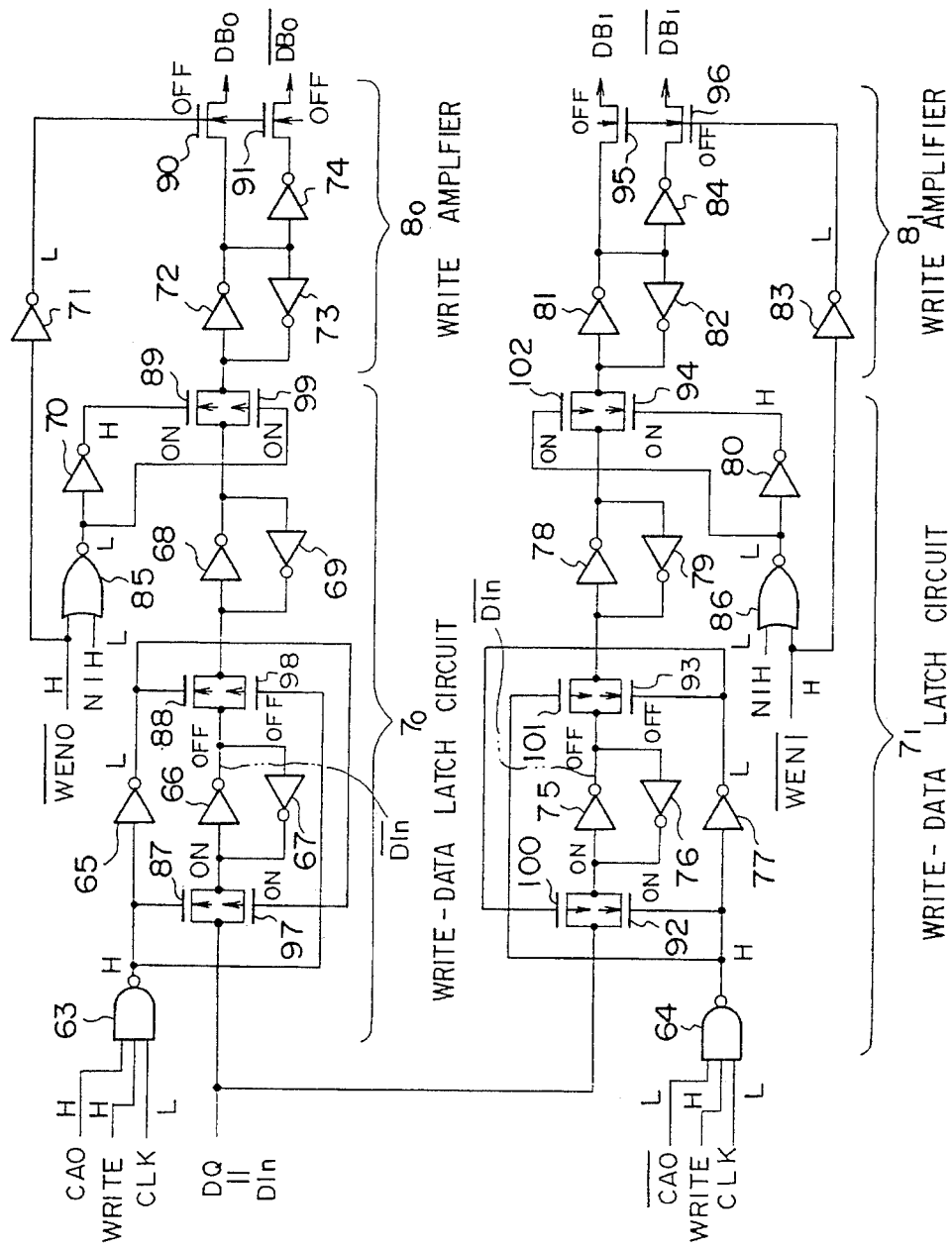
FIG. 29 is a circuit diagram for explaining operations of the write-data latch circuit and the write amplifier of FIG. 5 in the case of the high-speed SDRAM of the first embodiment.

As shown in FIG. 29, the write control signal WRITE becomes the high level in data writing. If the column address signal CA0 is set to the high level in the n-th cycle as described above while the external clock signal CLK is at the low level, the output of the NAND circuit 63 becomes the high level. Thus, the output of the inverter 65 becomes the low level, which leads to the nMOS transistor 87 and the pMOS transistor 97 being turned on and to the nMOS transistor 88 and the pMOS transistor 98 being turned off.

As a result, when the write data DQ is set to $DI_n$, the write data $DI_n$ is latched by the latch circuit comprised of the inverters 66 and 67, with the output of the inverter 66 being $/DI_n$.

Also, since the operation mode signal N1H is at the low level and the write-amplifier-output control signal /WEN0 is at the high level, the outputs of the NOR circuit 85 and the inverter 70 become the low level and the high level, respectively. Thus, the nMOS transistor 89 is turned on, and the pMOS transistor 99 is turned on.

In the write amplifier $8_0$, the output of the inverter 71 is at the low level, so that the nMOS transistors 90 and 91 are turned off.

In the write-data latch circuit $7_1$, the outputs of the NAND circuit 64 and the inverter 77 become the high level and the low level, respectively. Thus, the nMOS transistor 92, the pMOS transistor 100, the nMOS transistor 93, and the pMOS transistor 101 are turned on, on, off, off, respectively.

As a result, the write data $DI_n$ is latched by the latch circuit comprised of the inverters 75 and 76, with the output of the inverter 75 being $/DI_n$.

Also, since the write-amplifier-output control signal /WEN1 is at the high level, the outputs of the NOR circuit 86 and the inverter 80 become the low level and the high level, respectively. Thus, the nMOS transistor 94 is turned on, and the pMOS transistor 102 is turned on.

In the write amplifier $8_1$, the output of the inverter 83 is at the low level, so that the nMOS transistors 95 and 96 are turned off.

Figure 30:
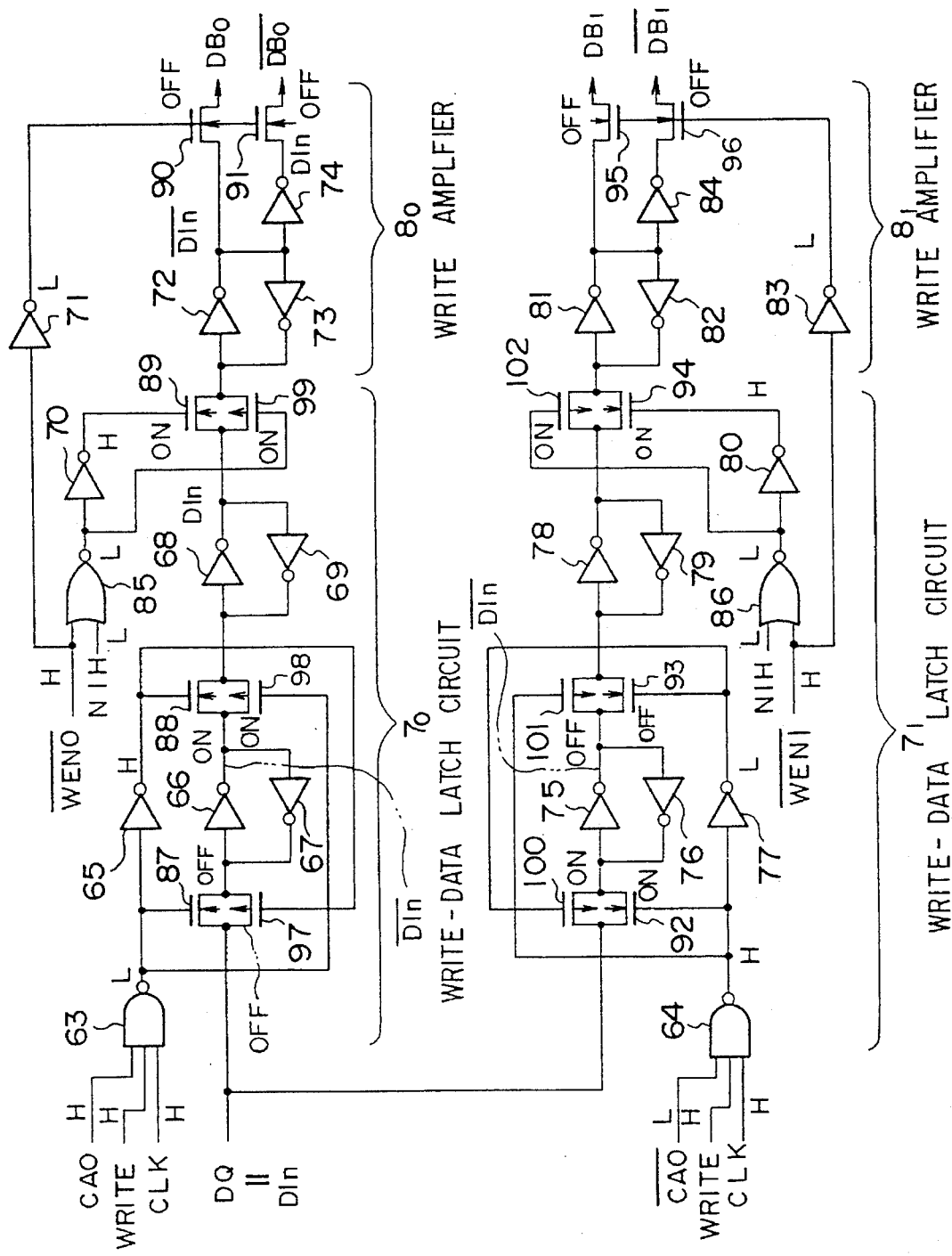
FIG. 30 is a circuit diagram for explaining operations of the write-data latch circuit and the write amplifier of FIG. 5 in the case of the high-speed SDRAM of the first embodiment.

When the external clock signal CLK is changed to the high level as shown in FIG. 30, the output of the NAND circuit 63 in the write-data latch circuit $7_0$ becomes the low level with the output of the inverter 70 being the high level. Thus, the outputs of the nMOS transistor 87, the pMOS transistor 97, the nMOS transistor 88, and the pMOS transistor 98 are turned off, off, on, and on, respectively.

Also, since the write-amplifier-output control signal /WEN0 is at the high level, the outputs of the NOR circuit 85 and the inverter 70 become the low level and the high level, respectively. Thus, the nMOS transistor 89 and the pMOS transistor 99 remain turned on.

In the write amplifier $8_0$ also, the output of the inverter 71 remains at the low level, leading to the nMOS transistors 90 and 91 remaining turned off.

As a result, the latch circuit comprised of the inverters 68 and 69 latches the reversed write data $/DI_n$, with the output of the inverter 68 being $DI_n$. Accordingly, the latch circuit comprised of the inverters 72 and 73 latches the write data $DI_n$, leading to the outputs of the inverters 72 and 74 being $/DI_n$ and $DI_n$, respectively.

In the write-data latch circuit $7_1$, the outputs of the NAND circuit 64 and the inverter 77 remain at the high level and the low level, respectively. Thus, the nMOS transistor 92, the pMOS transistor 100, the nMOS transistor 93, and the pMOS transistor 101 stay turned on, on, off, and off, respectively.

Also, since the write-amplifier-output control signal /WEN1 is at the high level, the outputs of the NOR circuit 86 and the inverter 80 remain at the low level and the high level, respectively. Thus, the nMOS transistor 94 and the pMOS transistor 102 remain turned on.

Accordingly, in the write amplifier $8_1$, the output of the inverter 83 remains at the low level, with the nMOS transistors 95 and 96 continuing to be turned off.

Figure 31:
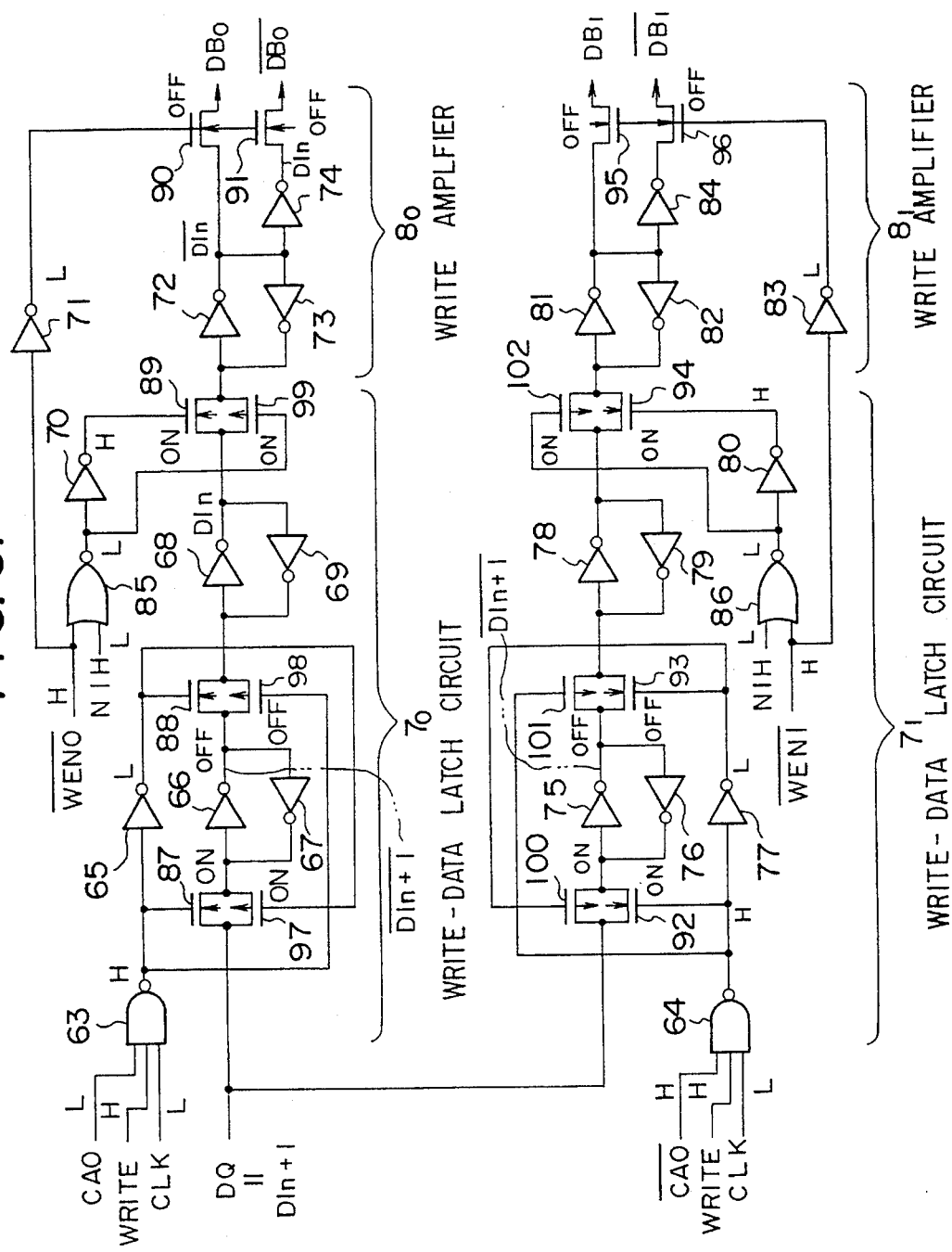
FIG. 31 is a circuit diagram for explaining operations of the write-data latch circuit and the write amplifier of FIG. 5 in the case of the high-speed SDRAM of the first embodiment.

Then, at the n+1-th cycle, the column address signal CA0 is set to the low level as shown in FIG. 31. During the low level period of the external clock signal CLK, the output of the NAND circuit 63 becomes the high level in the write-data latch circuit $7_0$, with the output of the inverter 65 being at the low level. Thus, the nMOS transistor 87, the pMOS transistor 97, the nMOS transistor 88, and the pMOS transistor 98 are turned on, on, off, and off, respectively.

As a result, when the write data DQ is set to $DI_{n+1}$, the write data $DI_{n+1}$ is latched by the latch circuit comprised of the inverters 66 and 67, with the output of the inverter 66 being $/DI_{n+1}$.

Also, since the write-amplifier-output control signal /WEN0 is at the high level, the outputs of the NOR circuit 85 and the inverter 70 become the low level and the high level, respectively. Thus, the nMOS transistor 89 remains turned on, and the pMOS transistor 99 also remains turned on.

Accordingly, in the write amplifier $8_0$, the output of the inverter 71 stays at the low level, so that the nMOS transistors 90 and 91 remain turned off.

In the write-data latch circuit $7_1$, the outputs of the NAND circuit 64 and the inverter 77 remain at the high level and the low level, respectively. Thus, the nMOS transistor 92, the pMOS transistor 100, the nMOS transistor 93, and the pMOS transistor 101 continue to be turned on, on, off, off, respectively.

As a result, the write data $DI_{n+1}$ is latched by the latch circuit comprised of the inverters 75 and 76, with the output of the inverter 75 being $/DI_{n+1}$.

Also, since the write-amplifier-output control signal /WEN1 is at the high level, the outputs of the NOR circuit 86 and the inverter 80 remain at the low level and the high level, respectively. Thus, the nMOS transistor 94 remains turned on, and the pMOS transistor 102 also remains turned on.

In the write amplifier $8_1$, the output of the inverter 83 stays at the low level, so that the nMOS transistors 95 and 96 continue to be turned off.

Figure 32:
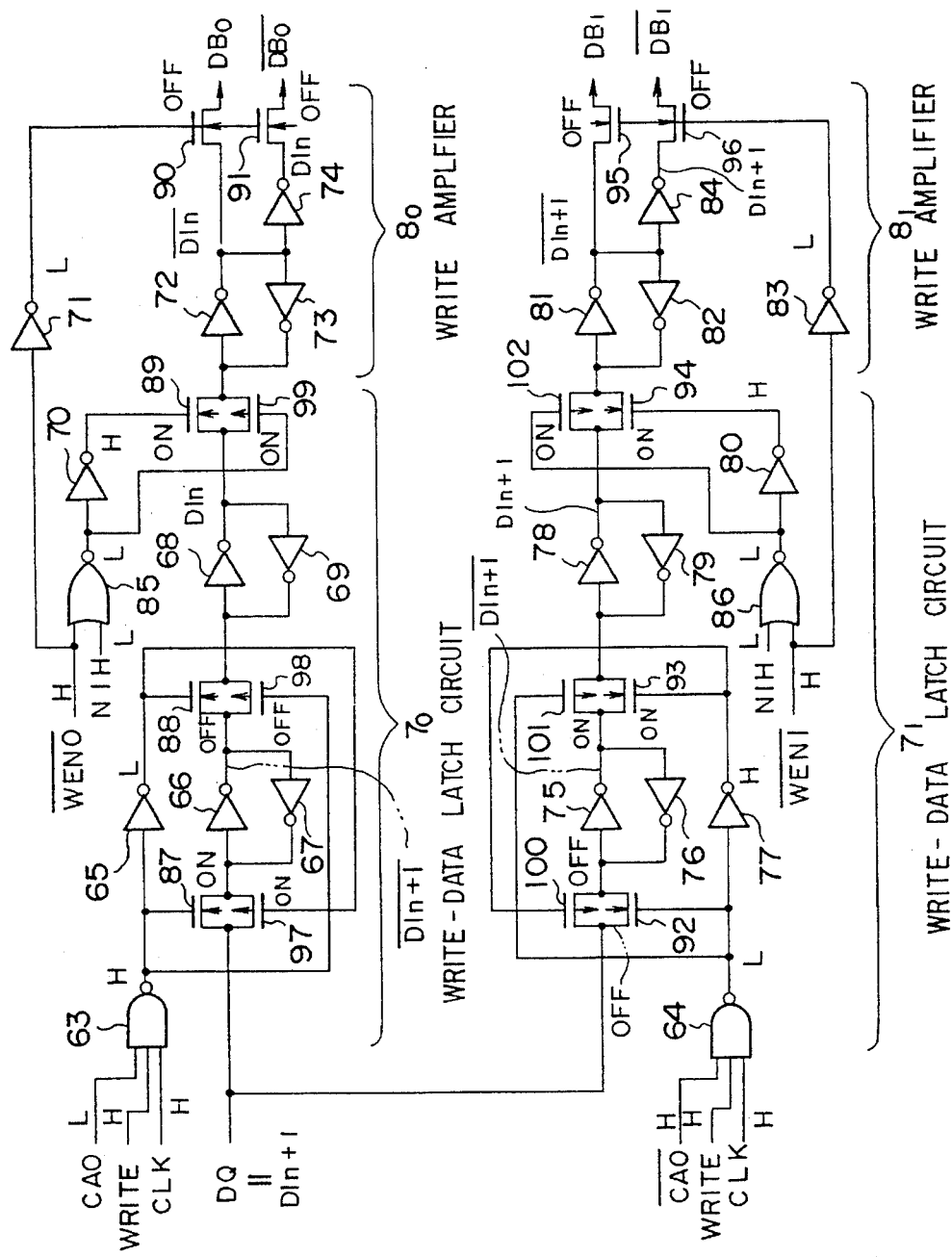
FIG. 32 is a circuit diagram for explaining operations of the write-data latch circuit and the write amplifier of FIG. 5 in the case of the high-speed SDRAM of the first embodiment.

Even when the external clock signal CLK is changed to the high level as shown in FIG. 32, the output of the NAND circuit 63 in the write-data latch circuit $7_0$ still remains at the high level with the output of the inverter 70 being the low level. Thus, the outputs of the nMOS transistor 87, the pMOS transistor 97, the nMOS transistor 88, and the pMOS transistor 98 continue to be turned on, on, off, and off, respectively.

Also, since the write-amplifier-output control signal /WEN0 is at the high level, the outputs of the NOR circuit 85 and the inverter 70 remain at the low level and the high level, respectively. Thus, the nMOS transistor 89 and the pMOS transistor 99 continue to be turned on.

In the write amplifier $8_0$ also, the output of the inverter 71 remains at the low level, leading to the nMOS transistors 90 and 91 remaining turned off.

In the write-data latch circuit $7_1$, the outputs of the NAND circuit 64 and the inverter 77 become the low level and the high level, respectively. Thus, the nMOS transistor 92, the pMOS transistor 100, the nMOS transistor 93, and the pMOS transistor 101 are turned off, off, on, and on, respectively.

Also, since the write-amplifier-output control signal /WEN1 is at the high level, the outputs of the NOR circuit 86 and the inverter 80 remain at the low level and the high level, respectively. Thus, the nMOS transistor 94 and the pMOS transistor 102 remain turned on.

Accordingly, in the write amplifier $8_1$, the output of the inverter 83 remains at the low level, with the nMOS transistors 95 and 96 continuing to be turned off.

As a result, the latch circuit comprised of the inverters 78 and 79 latches the output of the inverter 75, i.e., the reversed write data /DI$_{n+1}$, with the output of the inverter 78 being DI$_{n+1}$. Accordingly, the latch circuit comprised of the inverters 81 and 82 latches the write data DI$_{n+1}$, leading to the outputs of the inverters 81 and 84 being /DI$_{n+1}$ and DI$_{n+1}$, respectively.

Then, at the n+2-th cycle, the write-amplifier-output control signal /WEN0 and /WEN1 become the low level as shown in FIG. 27.

Figure 33:
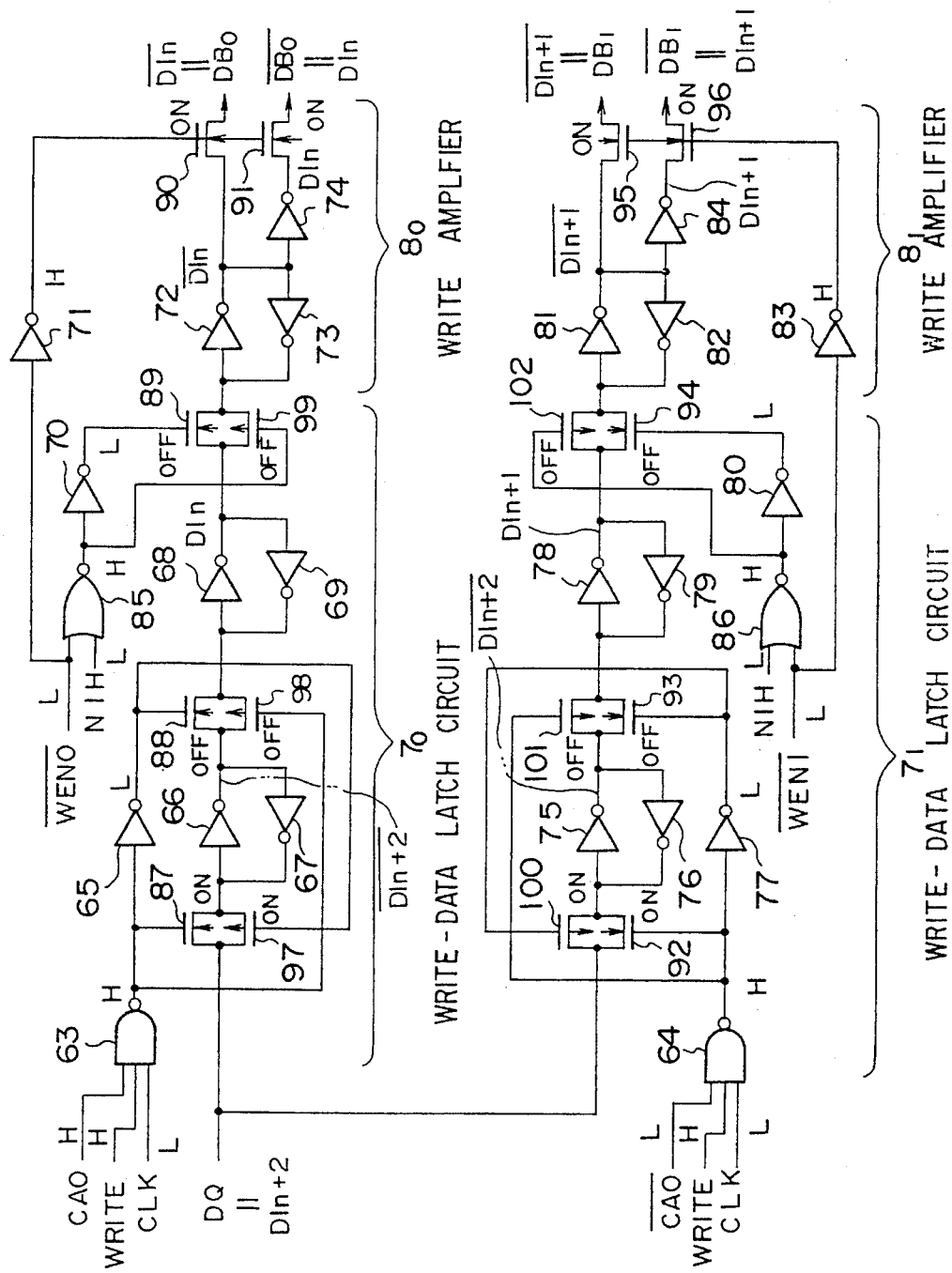
FIG. 33 is a circuit diagram for explaining operations of the write-data latch circuit and the write amplifier of FIG. 5 in the case of the high-speed SDRAM of the first embodiment.

As a result, in the write-data latch circuit 7$_0$, the output of the NOR circuit 85 becomes the high level with the output of the inverter 70 being at the low level as shown in FIG. 33. Thus, the nMOS transistor 89 and the pMOS transistor 99 are turned off.

In the write amplifier 8$_0$, the output of the inverter 71 becomes the high level, with the nMOS transistors 90 and 91 being turned on. Thus, the data bus line DB$_0$ becomes /DI$_n$, while the data bus line /DB$_0$ becomes DI$_n$.

In the write-data latch circuit 7$_1$, the output of the NOR circuit 86 becomes the high level with the output of the inverter 80 being at the low level. Thus, the nMOS transistor 94 and the pMOS transistor 102 are turned off.

In the write amplifier 8$_1$, the output of the inverter 83 becomes the high level, with the nMOS transistors 95 and 96 being turned on. Thus, the data bus line DB$_1$ becomes /DI$_{n+1}$, while the data bus line DB$_1$ becomes DI$_{n+1}$.

FIGS. 34A to 34G show a case in which data writing is carried out with regard to the column addresses 0, 1, 16, 17, 31, and 38.

Figure 34:
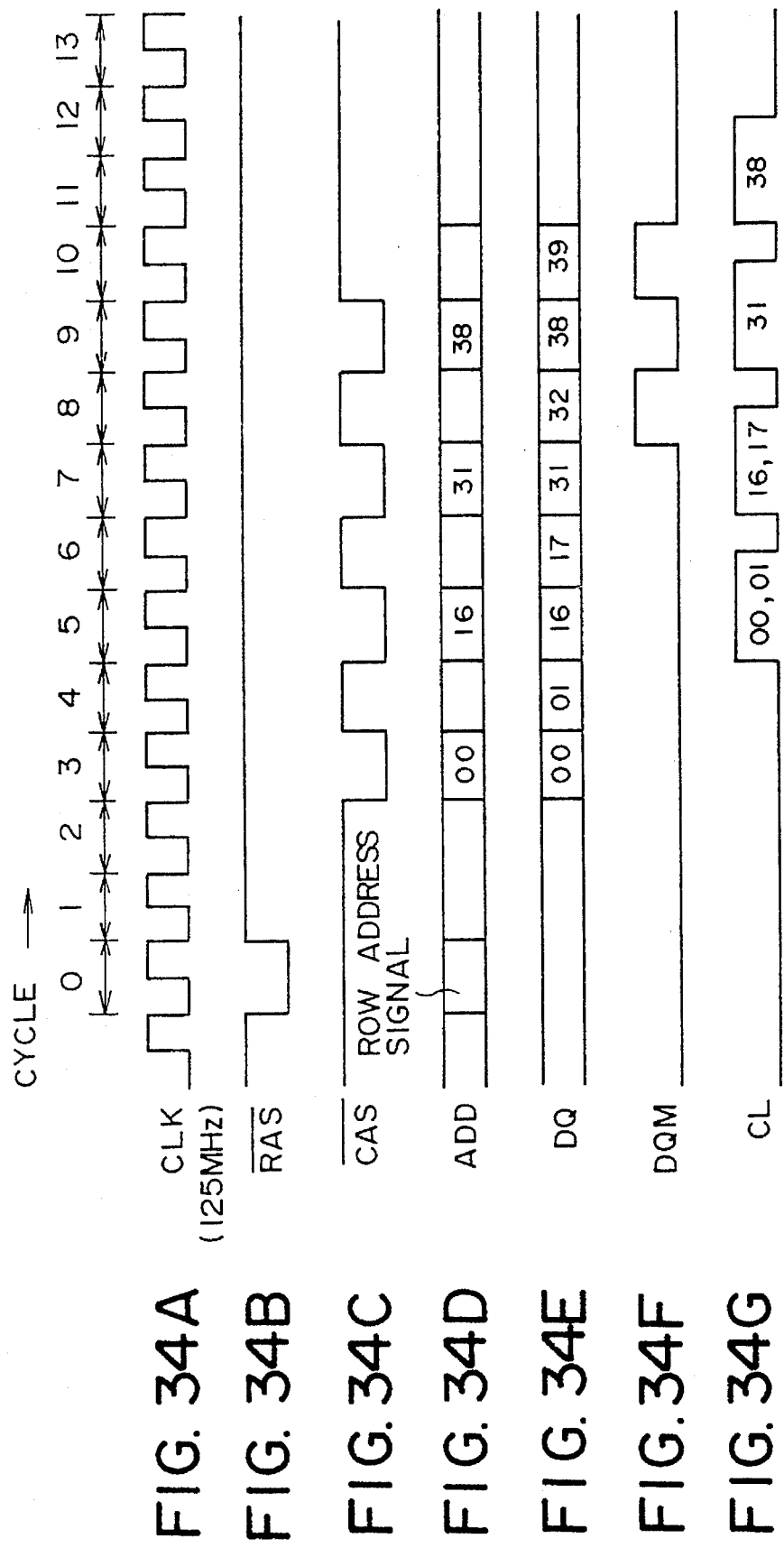
FIGS. 34A to 34G are time charts for explaining a writing operation of the high-speed SDRAM of the first embodiment.

FIG. 34A shows the external clock signal CLK, FIG. 34B shows the row address strobe signal /RAS, FIG. 34C shows the column address strobe signal /CAS, FIG. 34D shows the address signal ADD, FIG. 34E shows the input data DQ, FIG. 34F shows the data mask signal DQM, and FIG. 34G shows the column selection signal CL.

At a 0th cycle, when the row address strobe signal /RAS is changed to the low level, an address signal provided at the address signal input node is latched as a row address signal. This data latch is carried out at a positive edge of the external clock signal CLK. The row address signal is decoded to select a word line.

The column address strobe signal /CAS is changed to the low level, for example, at a third cycle. Then, at a positive edge of the external clock signal CLK, the column address signal indicating the 0th column address at the address input node is latched.

Also, at a positive edge of the external clock signal CLK, data provided at the data input/output node is latched by the write-data latch circuit 7$_0$. This data is the data which is to be written into the column address 0.

Then, at a fourth cycle, the column address strobe signal /CAS is changed to the high level. At a positive edge of the external clock signal CLK, data provided at the data input/output node to be written into the column address 1 is latched by the write-data latch circuit 7$_1$.

At a fifth cycle, the data latched in the write-data latch circuit 7$_0$ and the data latched in the write-data latch circuit 7$_1$ are simultaneously written into the column addresses 0 and 1, respectively.

Also, at the fifth cycle, the column address strobe signal /CAS is changed to the low level. Then, at a positive edge of the external clock signal CLK, a column address signal indicating the column address 16 at the address signal input node is latched.

Also, at the same positive edge of the external clock signal CLK, data provided at the data input/output node to be written into the column address 16 is latched by the write-data latch circuit 7$_0$.

At a sixth cycle, the column address strobe signal /CAS is changed to the high level. At a positive edge of the external clock signal CLK, data provided at the data input/output node to be written into the column address 17 is latched by the write-data latch circuit 7$_1$.

At a seventh cycle, the data latched in the write-data latch circuit 7$_0$ and the data latched in the write-data latch circuit 7$_1$ are simultaneously written into the column addresses 16 and 17, respectively.

Also, at the seventh cycle, the column address strobe signal /CAS is changed to the low level. At a positive edge of the external clock signal CLK, a column address signal indicating the column address 31 at the address signal input node is latched.

Also, at the same positive edge of the external clock signal CLK, data provided at the data input/output node to be written into the column address 31 is latched by the write-data latch circuit 7$_1$.

At an eighth cycle, the data mask signal DQM is changed to the high level. Thus, even though the column address strobe signal /CAS is changed to the high level, data provided at the data input/output node is not latched by the write-data latch circuit 7$_0$ at the positive edge of the external clock signal CLK as data to be written into the column address 32.

Accordingly, at a ninth cycle, only the data latched in the write-data latch circuit 7$_1$ is written into the column address 31.

At the ninth cycle, the column address strobe signal /CAS is changed to the low level. At a positive edge of the external clock signal CLK, a column address signal indicating the column address 38 at the address signal input node is latched.

Also, at the same positive edge of the external clock signal CLK, data provided at the data input/output node to be written into the column address 38 is latched by the write-data latch circuit 7$_0$.

At a tenth cycle, the data mask signal DQM is changed to the high level. Thus, even though the column address strobe signal /CAS is changed to the high level, data provided at the data input/output node is not latched by the write-data latch circuit 7$_1$ at the positive edge of the external clock signal CLK as data to be written into the column address 39.

Accordingly, at an eleventh cycle, only the data latched in the write-data latch circuit 7$_0$ is written into the column address 38.

In the manner as described above, the high-speed SDRAM produced according to the first embodiment of the present invention can carry out 2 cycle pre-fetch operations for two addresses having the same row address and consecutive column addresses. Although the high-speed SDRAM cannot carry out consecutive data writing operations for column addresses having the same row address and non-consecutive column addresses, it can operate at a high clock rate such as the 125 MHz of the external clock signal CLK.

As described above, according to the first embodiment of the present invention, an SDRAM having two data buses for one memory block can be made into either the low-speed SDRAM or the high-speed SDRAM by making a choice at the bonding process whether the bonding pad 13 is connected to the VCC power node 104, where the low-speed SDRAM can carry out consecutive writing operations for two addresses having the same row address and arbitrary column addresses, while the high-speed SDRAM can carry out 2 cycle pre-fetch operations for two addresses having the same row address and consecutive column addresses. A process of making the SDRAM into either of the two types is simple and easy to carry out, which results in a better operations management.

In the following, a second embodiment of the present invention will be described with reference to FIG. 35.

Figure 35:
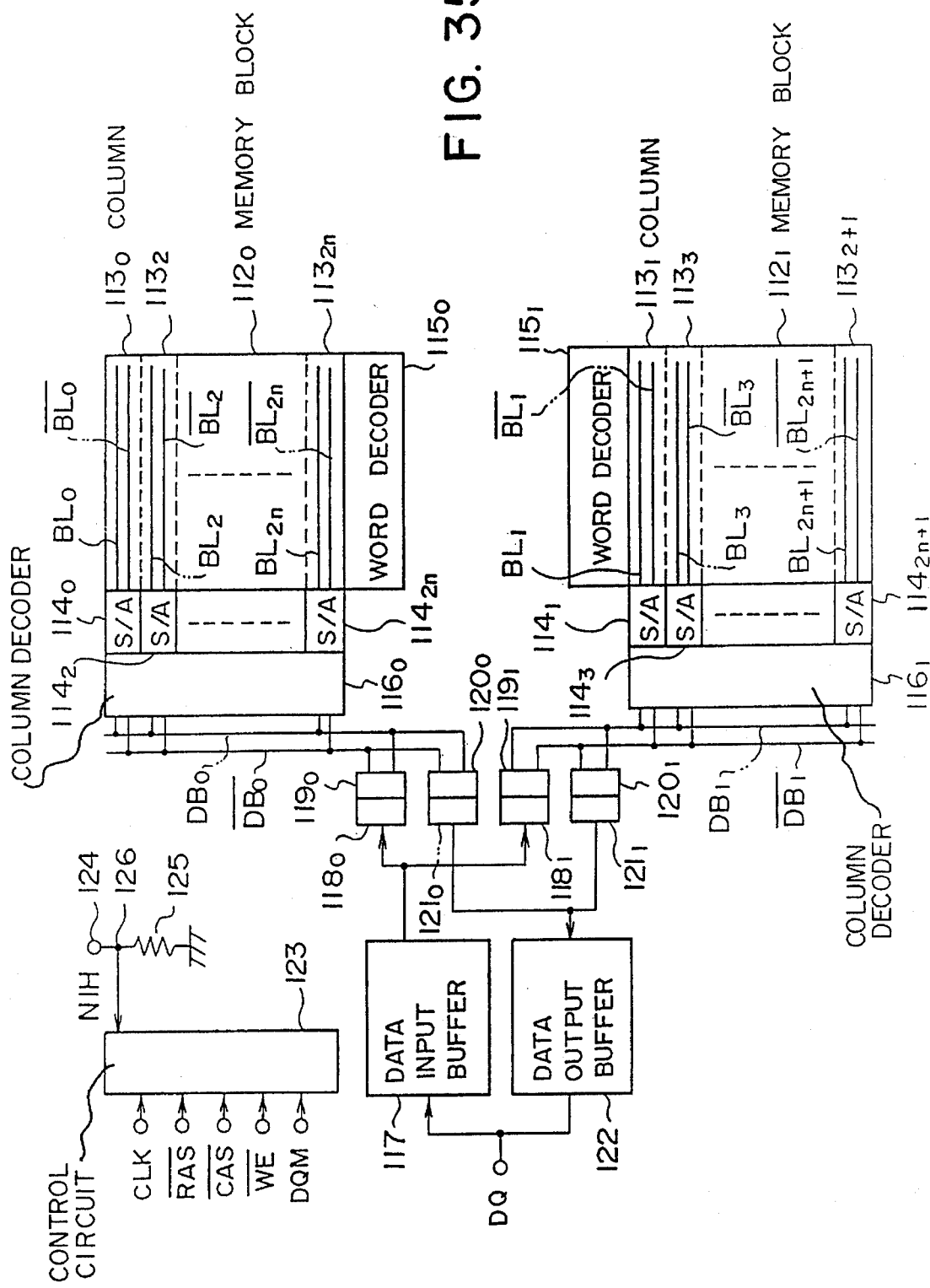
FIG. 35 is a block diagram for explaining a second embodiment of a method of forming an SDRAM according to the present invention.

FIG. 35 is a block diagram for explaining the second embodiment of a method of forming SDRAMs according to the present invention. FIG. 35 shows a circuit structure of a SDRAM chip prior to the bonding process.

An SDRAM formed according to the second embodiment has two memory blocks. In FIG. 35, memory blocks $112_0$ and $112_1$ are made up from an array of memory cells $113_0$, $113_2$, ..., and $113_{2n}$ represent columns of the memory block $112_0$, and $BL_k$ and $/BL_k$ (k=0, 2, ..., 2n) represent a pair of bit lines provided for each columns $113_k$. Sense amplifiers $114_k$ are also provided for each columns $113_k$.

A word decoder $115_0$ selects and drives one word line among word lines of the memory block $112_0$ by decoding a row address signal. A column decoder $116_0$ selects one column from columns of the memory block $112_0$ by decoding a column address signal.

A pair of data bus lines $DB_0$ and $/DB_0$ are provided for the memory block $112_0$. The data bus line $DB_0$ is shared by the bit lines $BL_0$, $BL_2$, ..., and $BL_{2n}$, and the data bus line $/DB_0$ is shared by the bit lines $/BL_0$, $/BL_2$, ..., and $/BL_{2n}$.

$113_1$, $113_3$, ..., and $113_{2n+1}$ represent columns of the memory block $112_1$, and $BL_{k+1}$ and $/BL_{k+1}$ represent a pair of bit lines provided for each columns $113_{k+1}$. Sense amplifiers $114_{k+1}$ are also provided for each columns $113_{k+1}$.

A word decoder $115_1$ selects and drives one word line among word lines of the memory block $112_1$ by decoding a row address signal. A column decoder $116_1$ selects one column from columns of the memory block $112_1$ by decoding a column address signal.

A pair of data bus lines $DB_1$ and $/DB_1$ are provided for the memory block $112_1$. The data bus line $DB_1$ is shared by the bit lines $BL_1$, $BL_3$, ..., and $BL_{2n+1}$, and the data bus line $/DB_1$ is shared by the bit lines $/BL_1$, $/BL_3$, ..., and $/BL_{2n+1}$.

A data input buffer 117 receives write data, and write-data latch circuits $118_0$ and $118_1$ latch write data received by the data input buffer 117.

A write amplifier $119_0$ is used for writing the write data latched by the write data latch circuit $118_0$ into the memory block $112_0$.

A write amplifier $119_1$ is used for writing the write data latched by the write data latch circuit $118_1$ into the memory block $112_1$.

A data bus amplifier $120_0$ amplifies data on the data bus lines $DB_0$ and $/DB_0$ read from the memory block $112_0$ via the column decoder $116_0$. A read-data latch circuit $121_0$ latches data which is amplified by the data bus amplifier $120_0$.

A data bus amplifier $120_1$ amplifies data on the data bus lines $DB_1$ and $/DB_1$ read from the memory block $112_1$ via the column decoder $116_1$. A read-data latch circuit $121_1$ latches data which is amplified by the data bus amplifier $120_1$.

A data output buffer 122 outputs the data latched by the read data latch circuit $121_0$ and $121_1$. Also, there is a control circuit 123 provided.

A circuit including a bonding pad 124 and a resister 125 provides an operation mode signal N1H at a node 126. The operation mode signal N1H determines whether the SDRAM is to operate as a low-speed SDRAM or as a high-speed SDRAM.

In the second embodiment of the present invention, the control circuit 123 is provided with the same circuit as the write-amplifier-output control-signal generation circuit of the first embodiment. Also, the write-data latch circuits $118_0$ and $118_1$ and the write amplifiers $119_0$ and $119_1$ have the same structures as the write-data latch circuits $7_0$ and $7_1$ and the write amplifiers $8_0$ and $8_1$, respectively, of the first embodiment.

Accordingly, in the second embodiment of the present invention, the bonding pad 124 is connected to the VCC power node through a wire in order to produce a low-speed SDRAM. In this case, the voltage level of the node 126 is set to VCC in operating the low-speed SDRAM, so that the operation mode signal N1H becomes the high level.

In order to produce a high-speed SDRAM, the bonding pad 124 is not connected to the VCC power node. In this case, the voltage level of the node 126 is set to the ground level 0 V in operating the high-speed SDRAM, so that the operation mode signal N1H becomes the low level.

Thus, according to the second embodiment of the present invention, an SDRAM having two memory blocks can be made into either the low-speed SDRAM or the high-speed SDRAM by making a choice at the bonding process whether the bonding pad 124 is connected to the VCC power node, where the low-speed SDRAM can carry out consecutive writing operations for two addresses having the same row address and arbitrary column addresses, while the high-speed SDRAM can carry out 2 cycle pre-fetch operations for two addresses having the same row address and consecutive column addresses. A process of making the SDRAM into either of the two types is simple and easy to carry out, which results in a better operations management.

Figure 36A:
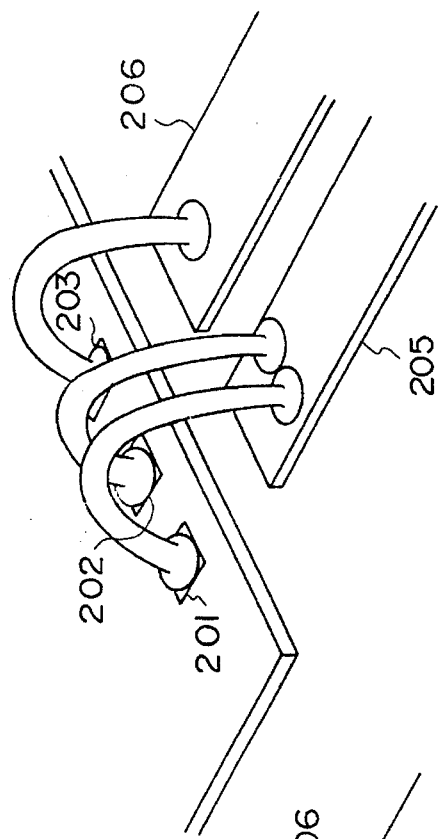
FIGS. 36A to 36C are process charts showing each step of a bonding process according to the present invention.
Figure 36B:
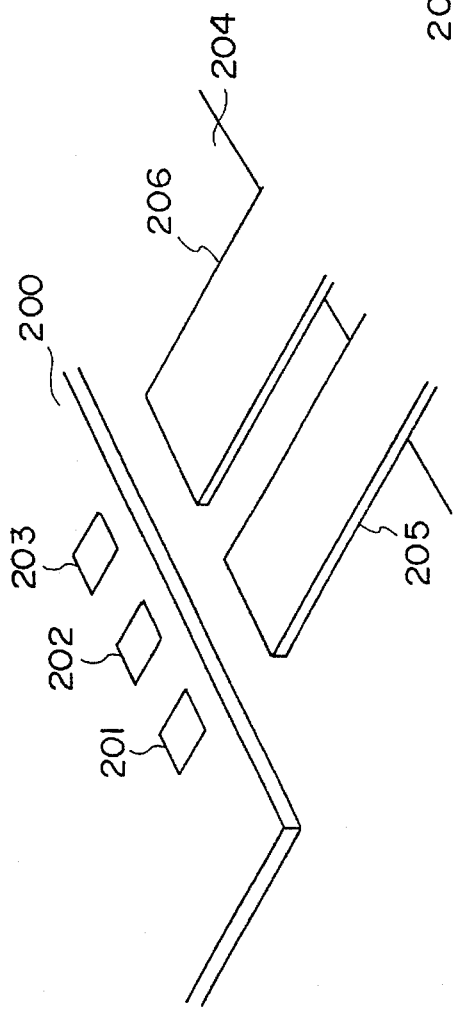
Figure 36C:
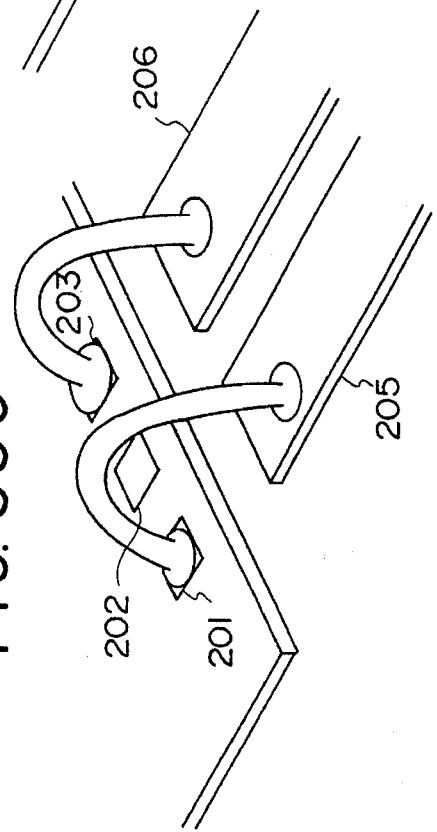

In the following, a bonding process in which an SDRAM is made into either the high-speed SDRAM or the low-speed SDRAM will be described with reference to FIGS. 36A to 36C. FIGS. 36A to 36C are a process chart showing each step of the bonding process.

In FIG. 36A, an SDRAM semiconductor chip 200 includes bonding pads 201, 202, and 203, which are a bonding pad for a VCC power voltage level, a bonding pad for selecting either the high-speed SDRAM or the low-speed SDRAM, and a bonding pad for a ground level, respectively. Here, the bonding pad 202 corresponds to the bonding pad 13 of the first embodiment or the bonding pad 124 of the second embodiment. The SDRAM semiconductor chip 200 is stored inside a package 204, which has a bonding stage 205 for the VCC power voltage level and a bonding stage 206 for the ground level.

In FIG. 36B, the bonding pads 201 and 203 are connected to the bonding stages 205 and 206, respectively, in order to establish electrical connections for the VCC power voltage level and the ground level. Also, the bonding pad 202 is connected to the bonding stage 205, so that the VCC power voltage level is provided for the bonding pad 202. Thus, the SDRAM semiconductor chip 200 operates as a low-speed SDRAM in this case.

In FIG. 36C, the bonding pads 201 and 203 are connected to the bonding stages 205 and 206, respectively, in order to establish electrical connections for the VCC power voltage level and the ground level. In this case, the bonding pad 202 is not connected to the bonding stage 205, so that the SDRAM semiconductor chip 200 operates as a high-speed SDRAM.

In FIG. 36A to FIG. 36C, a selection of either the low-speed SDRAM or the high-speed SDRAM is made at the bonding process by making a choice whether the bonding pad 202 is connected to the VCC power voltage level. Alternately, the selection can be made at a wiring process. Namely, either the low-speed SDRAM or the high-speed SDRAM can be selected at the wiring process by making a choice whether a predetermined node is connected to a VCC power voltage line.

Figure 37A:
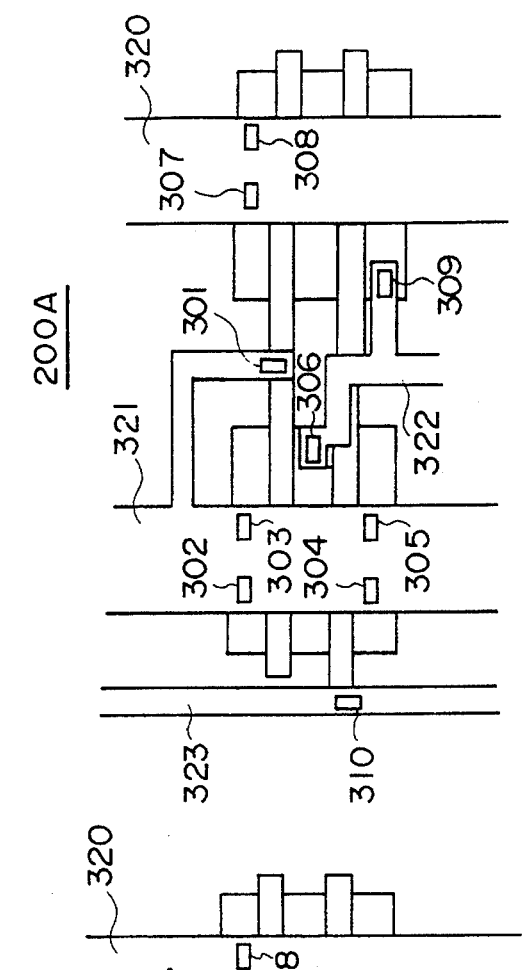
FIGS. 37A to 37C are process charts showing each step of a wiring process according to the present invention.
Figure 37B:
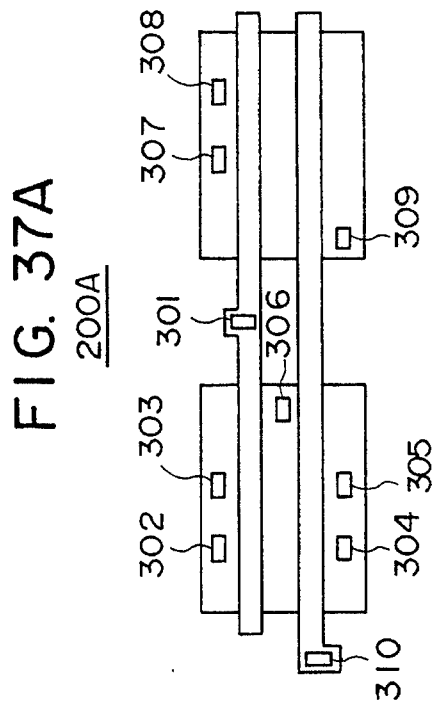
Figure 37C:
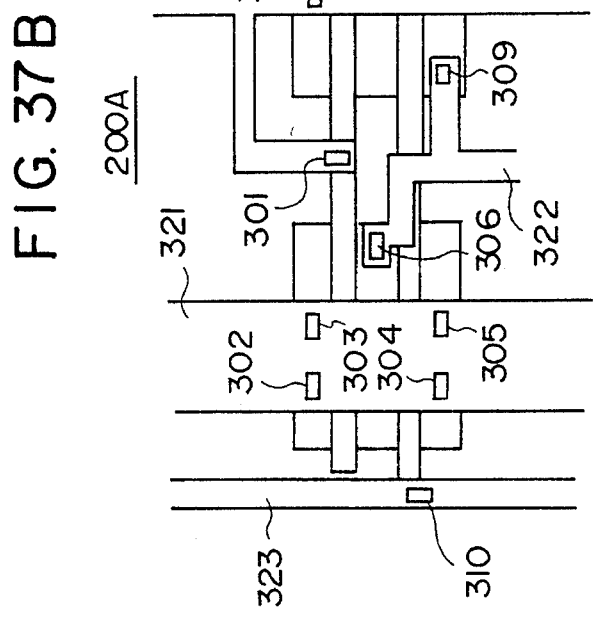

Such a wiring process in which an SDRAM is made into either the high-speed SDRAM or the low-speed SDRAM will be described with reference to FIGS. 37A to 37C. FIGS. 37A to 37C are a process chart showing each step of the wiring process.

In FIG. 37A, an SDRAM semiconductor chip 200A includes a predetermined node 301 for selecting either the high-speed SDRAM or the low-speed SDRAM, and nodes 302 to 310 provided for various circuit components. Here, the predetermined node 301 has the same function as the bonding pad 13 of the first embodiment or the bonding pad 124 of the second embodiment. Namely, the SDRAM semiconductor chip 200A can be turned into either the low-speed SDRAM or the high-speed SDRAM, depending on whether the predetermined node 301 is connected to the VCC power voltage level.

In FIG. 37B, each of the nodes 302 to 310 is connected to either a VCC power line 320, a ground line 321, or one of signal lines 322 and 323. Also, the predetermined node 301 is connected to the VCC power line 320, so that the VCC power voltage level is provided for the predetermined node 301. Thus, the SDRAM semiconductor chip 200A operates as a low-speed SDRAM in this case.

On the other hand, in FIG. 37C, the predetermined node 301 is not connected to the VCC power line 320, but is connected to the ground line 321. Thus the SDRAM semiconductor chip 200A operates as a high-speed SDRAM.

Figure 38:
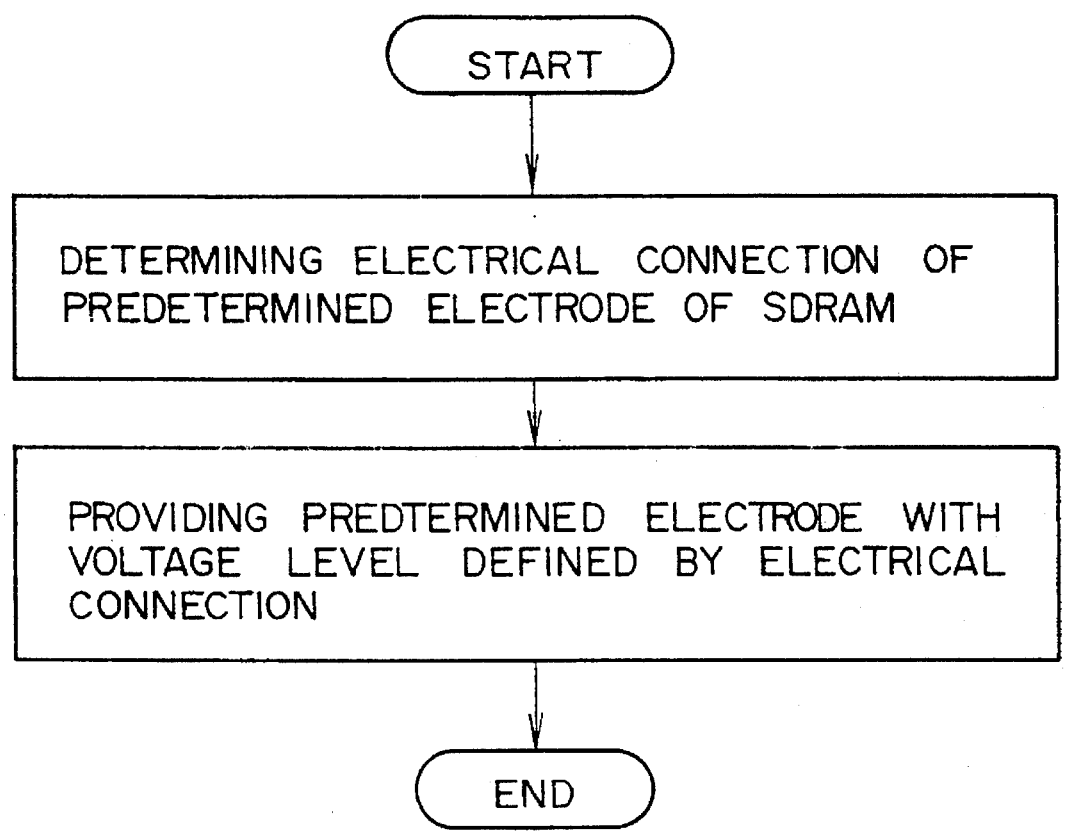
FIG. 38 is a flow chart of a method of forming an SDRAM according to the present invention.

FIG. 38 is a flow chart of a process of making the SDRAM into either the high-speed SDRAM or the low-speed SDRAM according to the present invention.

In FIG. 38, at a step S1, an electrical connection of a predetermined electrode of the SDRAM is determined. Namely, the predetermined electrode may be connected to a VCC power voltage level through wire bonding, as shown in FIG. 36B. Or the predetermined electrode may be left unconnected, as shown in FIG. 36C. Or the predetermined electrode may be connected to a ground level, as shown in FIG. 37C. Here, a form of the physical connection does not matter, as signified by the case where no physical connection is provided. In other words, what is determined at the step S1 is a circuit structure regarding the electrical connection of the predetermined electrode.

At a step S2, the predetermined electrode is provided with a voltage level defined by the electrical connection. This voltage level in turn defines an operation of the SDRAM, i.e., whether the SDRAM operates as the low-speed SDRAM or as the high-speed SDRAM.

At the step S2, the predetermined electrode may be provided with the VCC power voltage level, as shown in FIG. 36B, in order to form the low-speed SDRAM. However, it is possible to construct an SDRAM with a slight change in its control circuit structure, so that a ground level applied to a predetermined electrode of this SDRAM results in an operation as a low-speed SDRAM. The present invention is not limited to any of these particular examples.

As described above, according to the present invention, the SDRAM can be made into either the low-speed SDRAM or the high-speed SDRAM by determining an electrical connection of the predetermined electrode and providing the predetermined electrode with a voltage level defined by the electrical connection. Here, the low-speed SDRAM can carry out consecutive writing operations, and the high-speed SDRAM can carry out the 2 cycle pre-fetch operations. An easy process of making the SDRAM into either the high-speed SDRAM or the low-speed SDRAM can facilitate a better operations management.

Further, the present invention is not limited to these embodiments, but various variations and modifications may be made without departing from the scope of the present invention.

What is claimed is:

1. A method of making an SDRAM (synchronous dynamic random access memory) which operates as one of a low-speed type and a high-speed type, said method comprising the steps of:

a) providing a first pair of data bus lines and a second pair of data bus lines, said first pair of data bus lines being used for writing data into even number columns of memory cells and said second pair of data bus lines being used for writing data into odd number columns of said memory cells;

b) providing a latch-and-amplifier circuit for each of said first pair of data bus lines and said second pair of data bus lines, said latch-and-amplifier circuit receiving data and providing said data to a corresponding one of said first pair of data bus lines and said second pair of data bus lines;

c) providing a control circuit having a predetermined electrode, said control circuit controlling said latch-and-amplifier circuit; and d) determining an electrical connection of said predetermined electrode so as to provide said predetermined electrode with one of a first voltage level and a second voltage level, wherein when said first voltage level is applied to said predetermined electrode, said control circuit controls said latch-and-amplifier circuit to provide a given one of said data to said first set of data bus lines at a given clock cycle and to provide a next one of said data to said second set of data bus lines at a next clock cycle, so that said SDRAM operating as said low-speed type can carry out consecutive writing operations at a lower clock rate for two addresses having the same row address, and wherein when said second voltage level is applied to said predetermined electrode, said control circuit controls said latch-and-amplifier circuit to provide given one of said data to said first set of data bus lines at a given clock cycle and to provide a next one of said data to said second set of data bus lines at the same clock cycle, so that said SDRAM operating as said high-speed type can carry out simultaneous writing operations at a higher clock rate for two addresses having the same row address and consecutive column addresses.

2. An SDRAM which operates as one of a low-speed type and a high-speed type, said SDRAM comprising:

memory cells;

a first pair of data bus lines connected to even number columns of said memory cells for writing data thereto;

a second pair of data bus lines connected to odd number columns of said memory cells for writing said data thereto;

a latch-and-amplifier circuit provided for each of said first pair of data bus lines and said second pair of data bus lines, said latch-and-amplifier circuit receiving said data and providing said data to a corresponding one of said first pair of data bus lines and said second pair of data bus lines; and a control circuit controlling said latch-and-amplifier circuit, said control circuit having a predetermined electrode to which one of a first voltage level and a second voltage level is applied to select one of said low-speed type and said high-speed type, respectively, wherein when said first voltage level is applied to said predetermined electrode, said control circuit controls said latch-and-amplifier circuit to provide a given one of said data to said first set of data bus lines at a given clock cycle and to provide a next one of said data to said second set of data bus lines at a next clock cycle, and wherein when said second voltage level is applied to said predetermined electrode, said control circuit controls said latch-and-amplifier circuit to provide a given one of said data to said first set of data bus lines at a given clock cycle and to provide a next one of said data to said second set of data bus lines at the same clock cycle.

3. The method as claimed in claim 1, wherein said step d) comprises a step of determining said electrical connection at a bonding process of connecting said SDRAM to external nodes.

4. The method as claimed in claim 1, wherein said step d) comprises a step of determining said electrical connection at a wiring process of said SDRAM.

5. The method as claimed in claim 3, wherein said step d) comprises a step of connecting a predetermined pad of said SDRAM to an external power voltage level when forming said low-speed type, and leaving said predetermined pad of said SDRAM unconnected when forming said high-speed type, so that said electrical connection is determined.

6. The method as claimed in claim 4, wherein said step d) comprises a step of connecting a predetermined node of said SDRAM to a power line when forming said low-speed type and to a ground line when forming said high-speed type.

7. The method as claimed in claim 1, wherein said SDRAM has two memory blocks each made up from an array of said memory cells, one of said two memory blocks being said even number columns of said memory cells and the other of said two memory blocks being said odd number columns of said memory cells.

8. The method as claimed in claim 1, wherein said data is provided for said first set of data bus lines and said second set of data bus lines for a time period generally identical to a pulse width of a clock signal for writing said data when said SDRAM is said low-speed type, and said data is provided for said first set of data bus lines and said second set of data bus lines for a time period longer than said pulse width when said SDRAM is said high-speed type.

9. The SDRAM as claimed in claim 2, wherein said low-speed type can carry out consecutive writing operations at a lower clock rate for two addresses having the same row address, and said high-speed type can carry out simultaneous writing operations at a higher clock rate for two addresses having the same row address and consecutive column addresses.

10. The SDRAM as claimed in claim 9, wherein said SDRAM has two memory blocks each made up from an array of said memory cells, one of said two memory blocks being said even number columns of said memory cells and the other of said two memory blocks being said odd number columns of said memory cells.

11. The SDRAM as claimed in claim 9, wherein said data is provided for said first set of data bus lines and said second set of data bus lines for a time period generally identical to a pulse width of a clock signal for writing said data when said SDRAM is said low-speed type, and said data is provided for said first set of data bus lines and said second set of data bus lines for a time period longer than said pulse width when said SDRAM is said high-speed type.

* * * * *